(12) United States Patent
Bozorg et al.

(10) Patent No.: US 10,840,890 B2
(45) Date of Patent: Nov. 17, 2020

(54) DISCRETE TIME IIR FILTER WITH HIGH STOP BAND REJECTION

(71) Applicant: University College Dublin, Dublin (IE)

(72) Inventors: Amirhossein Ansari Bozorg, Dublin (IE); Robert Bogdan Staszewski, Dublin (IE)

(73) Assignee: UNIVERSITY COLLEGE DUBLIN, Dublin (IE)

( * ) Notice: Subject to any disclaimer, the term of this patent is extended or adjusted under 35 U.S.C. 154(b) by 0 days.

(21) Appl. No.: 16/238,604

(22) Filed: Jan. 3, 2019

(65) Prior Publication Data

US 2019/0207587 A1 Jul. 4, 2019

Related U.S. Application Data

(60) Provisional application No. 62/613,463, filed on Jan. 4, 2018.

(51) Int. Cl.
*H03H 17/04* (2006.01)
*H03H 19/00* (2006.01)

(52) U.S. Cl.
CPC ........ *H03H 17/0416* (2013.01); *H03H 19/00* (2013.01); *H03H 2210/025* (2013.01); *H03H 2240/00* (2013.01)

(58) Field of Classification Search
CPC ......... H03H 17/0416; H03H 2210/025; H03H 2240/00; H03H 17/06; H03H 17/0621
See application file for complete search history.

(56) References Cited

U.S. PATENT DOCUMENTS

| | | | |
|---|---|---|---|
| 9,148,125 B2* | 9/2015 | Tohidian | H03H 15/00 |
| 9,312,831 B2* | 4/2016 | Nestler | H03H 15/02 |
| 2014/0082040 A1* | 3/2014 | Pan | H03H 15/023 |
| | | | 708/819 |
| 2015/0214926 A1* | 7/2015 | Tohidian | H03D 7/125 |
| | | | 333/173 |

* cited by examiner

*Primary Examiner* — Jung Kim
(74) *Attorney, Agent, or Firm* — Zaretsky Group PC; Howard Zaretsky

(57) ABSTRACT

A novel and useful high-order discrete-time charge rotating (CR) infinite impulse response (IIR) low pass filter is presented. The filter utilizes history capacitor arrays incorporating banks of capacitors. A linear interpolation technique is used in the IIR filter with second order antialiasing filtering, whose transfer function is $sinc(x)^2$ per stage. It also uses a $g_m$ cell, rather than operational amplifiers, and is thus compatible with digital nanoscale technology. A $7^{th}$-order charge-sampling discrete time filter is disclosed. The order of the filter is easily extendable to higher orders. The charge rotating filter is process scalable with Moore's law and amenable to digital nanoscale CMOS technology. Bandwidth of the filter is precise and robust to PVT variation. The filter exhibits very low power consumption per filter pole, low input-referred noise, wide tuning range, excellent linearity and low area per minimum bandwidth and filter pole.

20 Claims, 22 Drawing Sheets

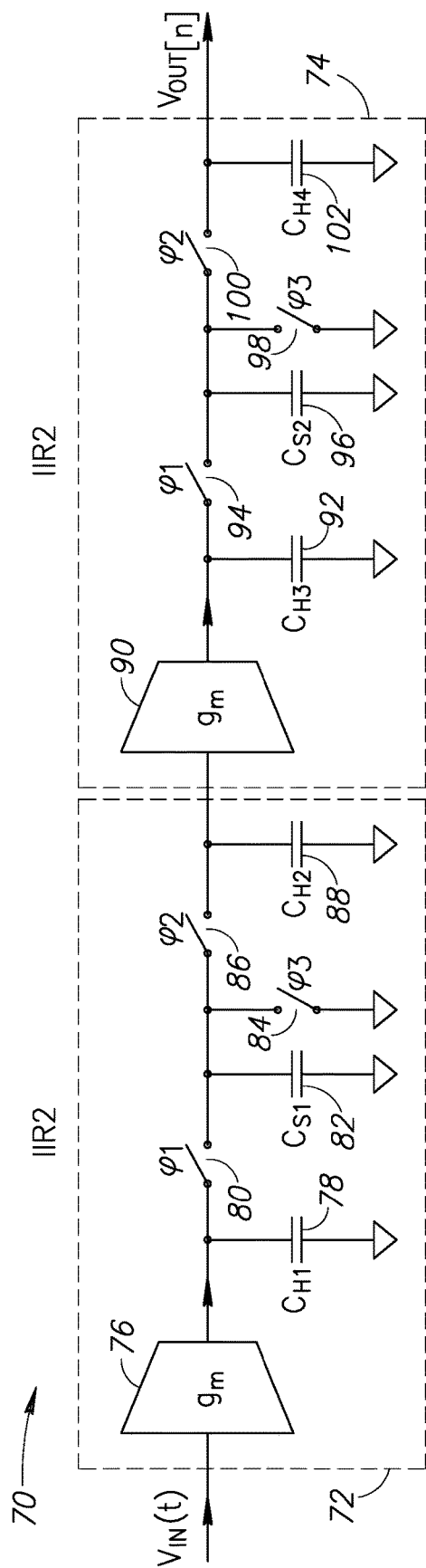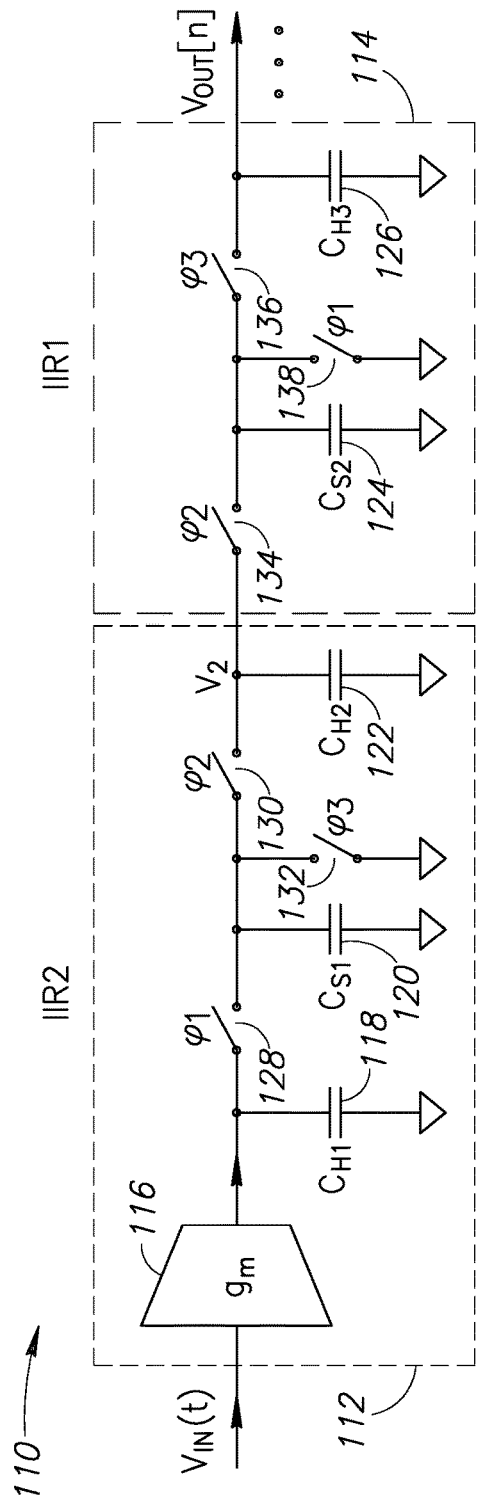
FIG.14
FIG.15

US 10,840,890 B2

DISCRETE TIME IIR FILTER WITH HIGH STOP BAND REJECTION

REFERENCE TO PRIORITY APPLICATION

This application claims priority to U.S. Provisional Application Ser. No. 62/613,463, filed Jan. 4, 2018, entitled "Discrete Time IIR Filter With High Stop Band Rejection For 5G Receivers In 28 nm CMOS," incorporated herein by reference in its entirety.

FIELD OF THE INVENTION

The present invention relates to the field of semiconductor integrated circuits and more particularly relates to a discrete time infinite impulse response (IIR) filer having high stop band rejection.

BACKGROUND OF THE INVENTION

Filters are well-known in the electrical art, functioning as key building blocks in wireless communications and analog signal processing. Cellular communication devices are the largest consumer of filters. Nowadays, billions of these devices are produced every year and even a small improvement in cost and power consumption has a large impact. For example, consider a zero intermediate-frequency (zero-IF or ZIF) receiver. After reception by the antenna, a preselect filter selects a desired band (tens of MHz wide) containing the desired signal (from hundreds of kHz to several MHz wide) which is then amplified by a low noise amplifier (LNA), then downconverted by a mixer to baseband. Then, a sharp low-pass filter (LPF) selects the desired channel. The channel select filter is followed by an ADC. To relax the ADC dynamic range or the required effective number of bits (ENOB), the channel select filter usually has a high order.

Recently, discrete time (DT) filters are becoming more and more important in communication circuits due to several reasons. First, advance CMOS technology is applicable to switches, inverters and capacitors which all are process scalable. Using DT filters, better results can be achieved by moving to finer processes because of the availability of faster switches, high density capacitors and faster low power digital circuitry. One issue, however, is the out of band rejection strength which needs to be high enough in advanced communication systems such as 5G.

An infinite impulse response (IIR) is a property applying to numerous linear time invariant systems. Examples of linear time invariant systems include electronic and digital filters. IIRs are distinguished by having an impulse response which does not become zero beyond a certain point in time, but continues indefinitely.

In conventional IIR filtering, window integration behaves like a zero-order hold (ZOH) which forms a continuous-time (CT) sinc(x) antialiasing filter. In practice, however, the realization of linear interpolation is very complex. For example, a rectangular boxcar T convolved with itself yields a triangle response whose transfer function is $sinc(x)^2$.

Although a first order antialiasing filter helps to achieve better stop band rejection, the stop band rejection strength might not be sufficient for advanced communication systems such as 5G. Moreover, the convolving of two boxcar T requires use of another Gm cell to convert the voltage to current for providing the second boxcar. This consumes additional power and it is not effective from a power consumption and area point of view.

There is thus a need for a passive IIR filter that has high stop band rejection, very low power consumption to increase battery life, low noise to improve the overall noise performance of the system as well as good linearity to be effective in the presence of interferer signals.

SUMMARY OF THE INVENTION

A novel and useful high-order discrete-time charge rotating (CR) infinite impulse response (IIR) having high stop band rejection is presented. The filter of the present invention is suitable for use in a wide variety of circuits and in particular is suitable for use in 5G receivers, such as those fabricated in 28 nm CMOS. The IIR filter disclosed herein takes advantage of second-order antialiasing filtering. Consequently, stop band rejection improves by more than 30 dB in comparison to state-of-the-art filters. By using a linear interpolation technique in the IIR filter, second order antialiasing filtering, whose transfer function is $sinc(x)^2$ per stage, has been achieved. Consequently, the stop-band rejection can be improved which leads to improved attenuation of unwanted signals folded from multiples of the sample frequency $f_s$.

In one embodiment, the filter utilizes capacitors and an optional $g_m$-cell, rather than operational amplifiers, and is thus compatible with digital nanoscale technology. A $7^{th}$-order charge-sampling discrete time filter is disclosed. The order of the filter is easily extendable to higher orders. The charge rotating filter is process scalable with Moore's law and amenable to digital nanoscale CMOS technology. Bandwidth of this filter is precise and robust to PVT variation. The filter exhibits very low power consumption per filter pole, ultra-low input-referred noise, wide tuning range, excellent linearity and low area per bandwidth and filter pole.

There is thus provided in accordance with the invention, a charge rotating discrete time analog filter, comprising an input node for receiving an input signal, a plurality of arrays of history capacitors, each history capacitor array operative to perform charge sharing among its elements, a sampling capacitor coupled to said plurality of arrays of history capacitors and operative to cyclically share charge with said plurality of arrays of history capacitors, wherein during each multi-phase cycle of said filter, each history capacitor array is individually connected to said sampling capacitor such that only a single history capacitor array is connected to said sampling capacitor during each phase, and wherein an output node coupled to one of said history capacitors arrays generates a filtered output signal once each cycle.

There is also provided in accordance with the invention, a charge rotating discrete time analog filter, comprising an input node for receiving an input signal, a first history capacitor array coupled to said input node, a plurality of switch banks coupled to said first history capacitor array, each switch bank comprising a non-switched sampling capacitor configured to share charge with said first history capacitor array, a plurality of second history capacitor arrays coupled to and configured to cyclically share charge with the sampling capacitor in each respective switch bank, each first and second history capacitor array operative to perform charge sharing among its elements, wherein during each multi-phase cycle of said filter, each second history capacitor array individually connected to its respective sampling capacitor such that only a single second history capacitor array is connected to said sampling capacitor during each phase, and wherein an output node coupled to one of said history capacitors arrays in a switch bank generates a filtered output signal once each phase period.

There is further provided in accordance with the invention, a method of analog charge rotating filtering in discrete time, the method comprising receiving an input signal, charging a first history capacitor array with said input signal, sharing charge with a sampling capacitor coupled to said first history capacitor array, cyclically sharing charge between said sampling capacitor and a plurality of second history capacitor arrays, each first and second history capacitor array operative to perform charge sharing among its elements, wherein during each multi-phase cycle of said filter, each second history capacitor array is individually connected to said sampling capacitor such that only a single second history capacitor array is connected to said sampling capacitor during each phase, and wherein an output node coupled to one of said second history capacitors arrays generates a filtered output signal once each cycle.

There is also provided in accordance with the invention, a charge rotating discrete time analog filter, comprising an input node for receiving an input signal, a plurality of switch banks coupled to said input signal, each switch bank comprising a first switch coupled to said input signal, a sampling capacitor coupled to said first switch and configured to cyclically share charge with a plurality of history capacitor arrays during each cycle of the filter, a plurality of second switches, each switch coupled to said sampling capacitor and to a respective history capacitor array, wherein during each multi-phase cycle of said filter, each history capacitor array is individually connected to its respective sampling capacitor such that only a single history capacitor array in each switch bank is connected to its respective sampling capacitor during each phase, and wherein an output node coupled to one of said history capacitors arrays generates a filtered output signal once each phase period.

BRIEF DESCRIPTION OF THE DRAWINGS

The invention is herein described, by way of example only, with reference to the accompanying drawings, wherein:

FIG. 14 is a schematic diagram illustrating an example $4^{th}$ order filter;

FIG. 15 is a schematic diagram illustrating an example $3^{rd}$ order filter;

DETAILED DESCRIPTION OF THE INVENTION

Three types of analog filters include: gm-C, active RC and active switched-capacitor filters. The gm-C filter uses gm-cells and capacitors to construct a desired transfer function (TF). The bandwidth (BW) of this filter can be relatively high. In this filter, pole locations depend on $g_m$ and capacitance values. These two values are affected independently by process, voltage and temperature (PVT) variations and cause considerable variation in bandwidth and transfer function of the filter. Hence, the filter requires a calibration mechanism running periodically or in the background. This makes the filter quite complicated with power and area disadvantages. This filter also features low to moderate linearity.

An active RC filter can have relatively high linearity. In this type of filter, pole locations are set by resistor and capacitor values. Since these two are also sensitive to process and temperature variations and do not track each other, this type of filter also requires calibration. An active switched-capacitor filter that does not have this problem has pole locations set by the capacitor ratio that is very accurate and independent from PVT variation in monolithic implementations. This filter, however, dissipates a significant amount of power in the operational amplifiers (op amps) to ensure good settling. Also, its sampling rate is limited by the speed of the op amps. Thus, it typically cannot achieve a very high bandwidth.

Both the active RC and switched-capacitor filters need a very carefully designed active analog component. In a gm-C filter, a very linear $g_m$ cell with high swing and low noise is required. Active RC and active switched-capacitor filters need a fast-settling op amp with high gain. By scaling down CMOS process technology to deep nanoscale, it is becoming more difficult to design and implement such an active analog component. This is mainly due a lower voltage headroom and lower MOS intrinsic gain.

In another embodiment, a discrete-time (DT) passive analog signal processing technique avoids the aforementioned problems. Passive discrete time FIR/IIR filters using switched-capacitor techniques are used for baseband signal processing and channel selection of an RF receiver. High order discrete time passive filtering is used based on a rotating switched-capacitor topology that offers excellent noise, linearity and very low power consumption.

Figure 1:
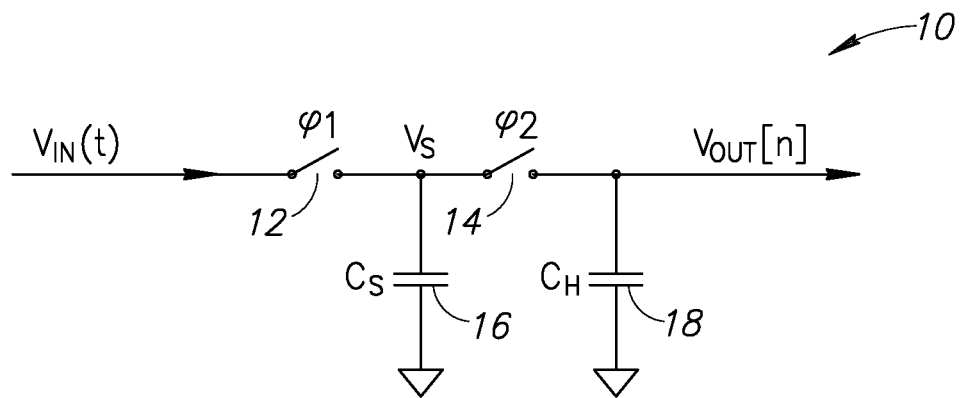
FIG. 1 is a schematic diagram illustrating an example voltage sampling $1^{st}$ order discrete time IIR filter.
Figure 3:
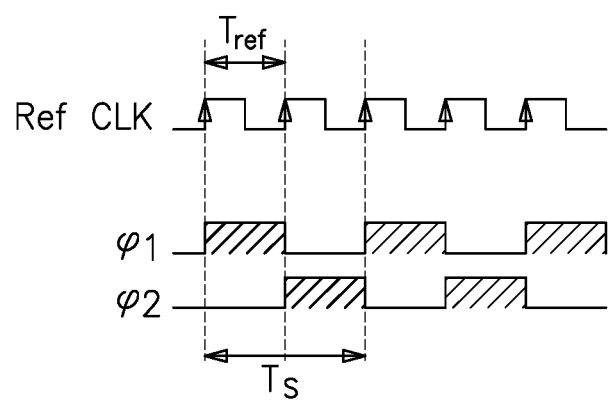
FIG. 3 is a diagram illustrating clock waveforms of the circuits of FIGS. 1 and 2.

Basic discrete time IIR low-pass filter structures are described below followed by an example high-order filter. The description begins with first order filters. The simplest analog discrete-time (DT) filter is a passive first-order IIR low-pass filter as shown in FIG. 1. In each cycle at φ1 a sampling capacitor $C_S$ 16 samples a continuous-time input voltage $V_{in}(t)$. Hence, it is called a voltage sampling filter. Then at φ2, $C_S$ shares its stored charge with a history capacitor $C_H$ 18. At the end of φ2, we have the following equation for the output voltage $$V_{out}[n] = \frac{C_H}{C_H + C_S} V_{out}[n-1] + \frac{C_S}{C_H + C_S} V_{in}[n-0.5] \quad (1)$$

where n is a sample number. Hence, its transfer function can be written in the z-domain as $$\frac{V_{out}(z)}{V_{in}(z)} = \frac{(1-\alpha)z^{-0.5}}{1-\alpha z^{-1}} \quad (2)$$

where α is $C_H/(C_H+C_S)$. This is a standard form of a discrete time low-pass filter (LPF) with unit dc gain and half-a-cycle delay. Switch driving clock waveforms are shown in FIG. 3.

Figure 4:
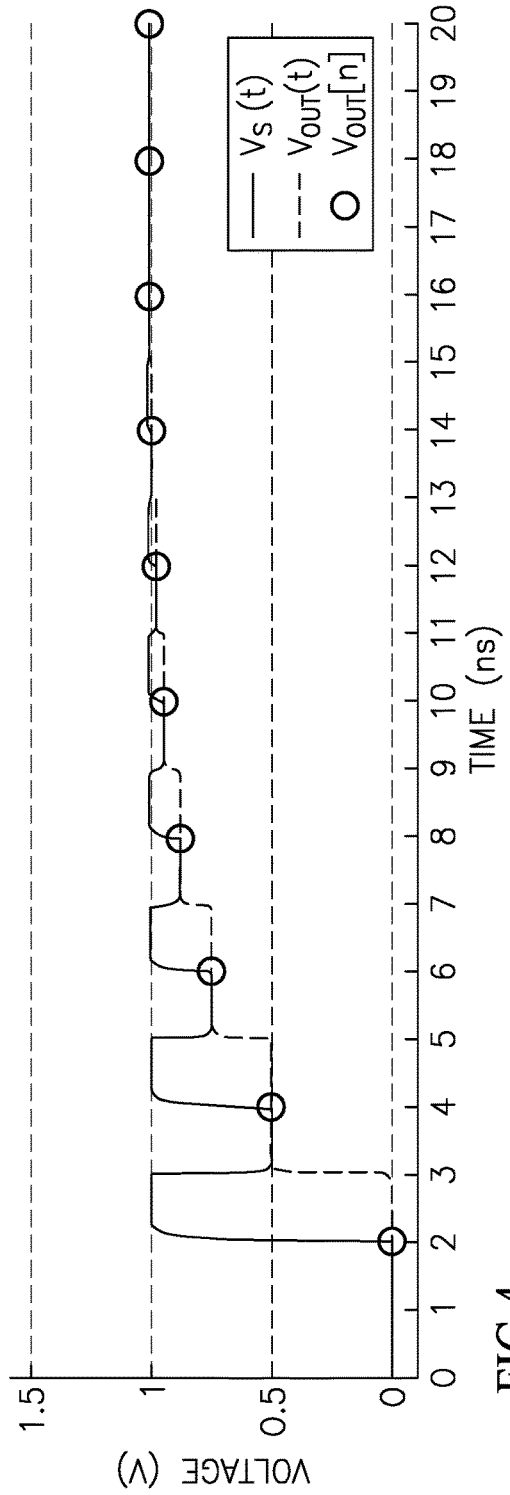
FIG. 4 is a diagram illustrating the step response of the voltage sampling $1^{st}$ order discrete time IIR filter of FIG. 1.

The step response of this filter is shown in FIG. 4. $C_S$ and $C_H$ are chosen to be 1 pF each for illustration purposes only. Discrete-time output samples are available in each cycle at the end of φ2. At first, suppose that both $C_S$ and $C_H$ are empty of charge. Then, the input step comes at the time of 1 ns. Next, in phase φ1, $C_S$ samples the input voltage and at 2 ns is charged to a 1V potential. Then, in phase φ2, it shares its charge with $C_H$. As $C_S$ and $C_H$ have equal capacitance in this example, the first output sample becomes 0.5V at 4 ns. In the next cycle, $C_S$ is again charged to 1V and when it is connected to $C_H$ at φ2, the next output sample reaches 0.5V+0.25V=0.75V. This process continues in subsequent cycles as depicted.

Figure 2:
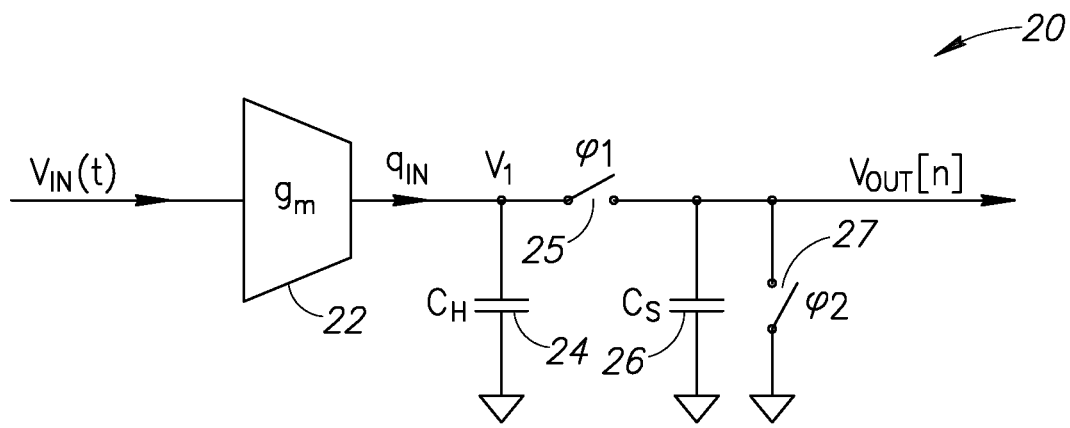
FIG. 2 is a schematic diagram illustrating an example charge sampling $1^{st}$ order discrete time IIR filter.

FIG. 2 shows an alternative $1^{st}$-order discrete time low pass filter (LPF) (referred to as IIR1) that exploits charge sampling. At first, the continuous-time input voltage is converted into current by a gm-cell 22. This current is integrated over a time window on $C_H$ 24 and $C_S$ 26. Hence, we can consider a discrete-time input charge packet arriving every cycle at φ1

$$q_{in}[n] = \int_{(n-1)/T_s}^{nT_s} g_m V_{in}(t) \cdot dt \quad (3)$$

where $T_S$ is the sampling period. At this phase, $C_S$ samples a part of input charge and the $C_H$ charge. Consequently, we have the discrete time (DT) output samples at the end of φ1

$$V_{out}[n] = \frac{C_H}{C_H + C_S} V_{out}[n-1] + \frac{1}{C_H + C_S} q_{in}[n] \quad (4)$$

$$\frac{V_{out}(z)}{q_{in}(z)} = \frac{1}{C_S} \times \frac{1-\alpha}{1-\alpha z^{-1}} \quad (5)$$

Figure 5:
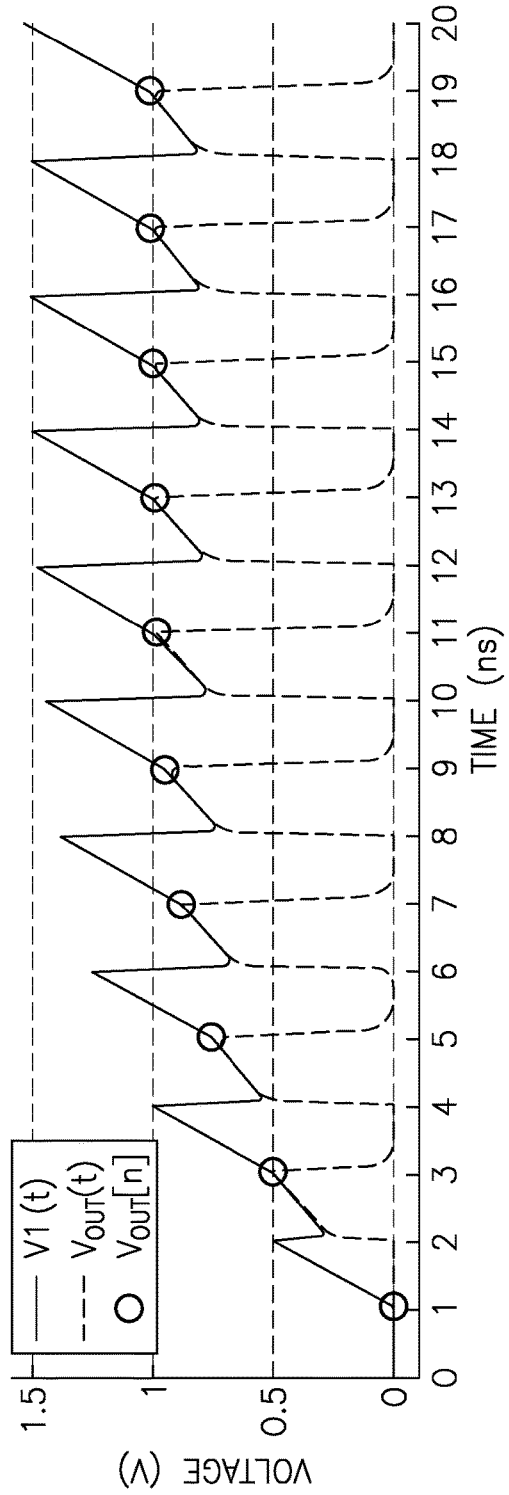
FIG. 5 is a diagram illustrating the step response of the charge sampling $1^{st}$ order discrete time IIR filter of FIG. 2.

The step response of this filter is shown in FIG. 5. In this example, $C_S$ and $C_H$ are 1 pF and $g_m$ is 0.5 mS. At first, suppose that the voltage at $C_H$ 24 is zero. The input step voltage appears at 1 ns and causes a constant 0.5 mA current to flow from the gm-cell 22. This current is integrated on $C_H$ during φ2. Also, at this time, $C_S$ 26 is reset to zero. Then, at φ1, $C_H$ is connected to $C_S$ thus sharing its charge. During φ1, the input current is integrated on both capacitors. At the end of φ1 (i.e. at 3 ns) an output sample of 0.5V is generated. Likewise, it is transferred to the subsequent cycles thus producing 0.75V, 0.875, etc., as output samples over time. Although the assumption applied in (3) changes the transient waveforms of FIG. 5 slightly, it leads to exactly the same values of the output samples while simplifying the analysis of the filter.

In the above two structures $C_S$ behaves like a lossy component that leaks a time-averaged current from $C_H$ to ground. We might call it a DT resistor (also referred to as a switched-capacitor resistor). This resistor in parallel with the capacitor makes a first order low-pass filter.

Figure 6:
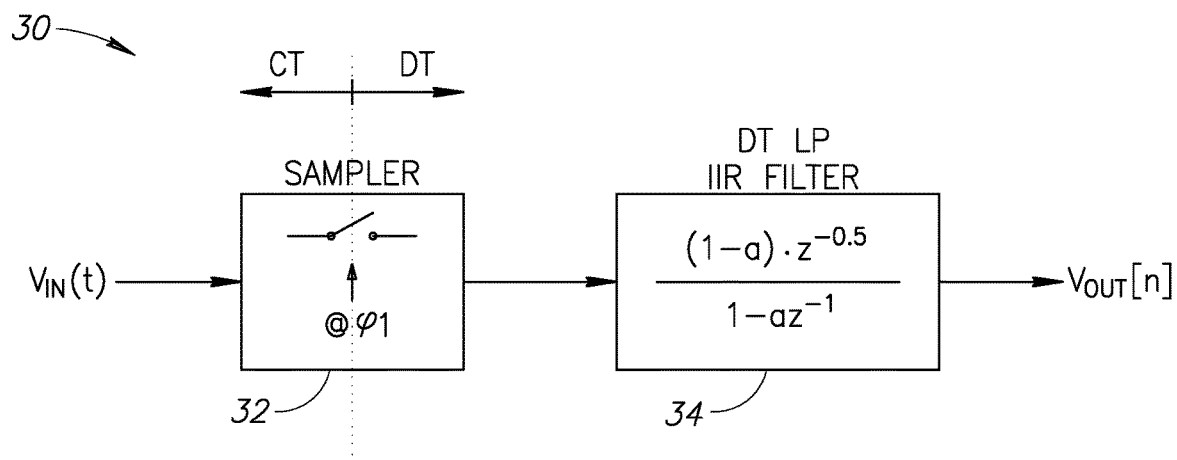
FIG. 6 is a block diagram illustrating a model of voltage sampling IIR1.
Figure 8:
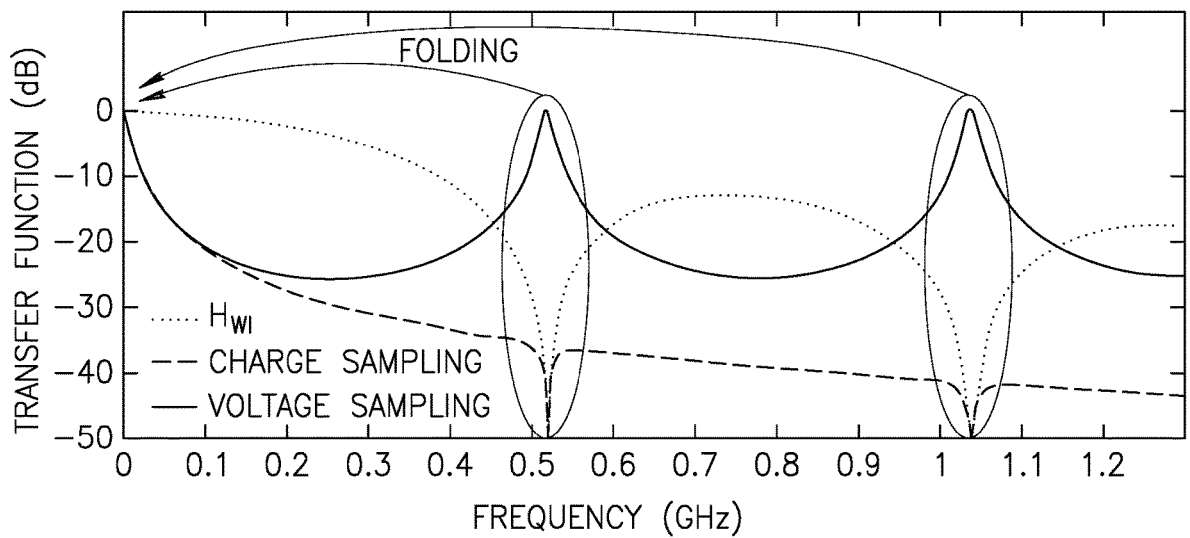
FIG. 8 is a diagram illustrating a wideband transfer function of IIR1.
Figure 9:
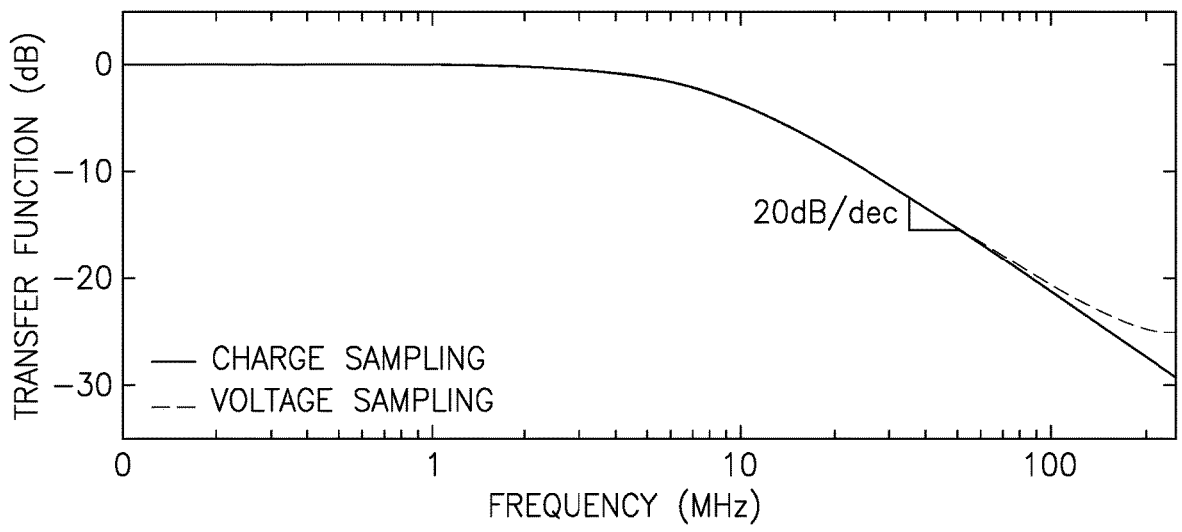
FIG. 9 is a diagram illustrating a Bode plot frequency response of IIR1.

A block diagram illustrating a model of voltage sampling IIR1 shown in FIG. 6. A block diagram illustrating a model of charge sampling IIR1 shown in FIG. 7. In the voltage-sampling structure of FIG. 6, the sampler 32 first samples the continuous-time (CT) analog input voltage $V_{in}(t)$ at φ1 and converts it into a DT analog voltage. Then, this signal is fed to a first-order LPF 34 with half-a-cycle delay ($z^{-0.5}$) and the output comes out every cycle at φ2. The dc voltage gain of this filter is unity. Based on the Nyquist sampling theory, sampling of a CT signal folds frequencies around k×$f_s$ (for k=1, 2, 3 . . . ) into around dc, where $f_s$ is the sampling frequency. As shown in FIG. 8 which plots the wideband frequency response of the voltage-sampling DT filter, we observe the folding image frequencies at $f_s$, $2f_s$ and so on. FIG. 9 shows the Bode plot of this transfer function, which has a roll-off of 20 dB/dec.

Figure 7:
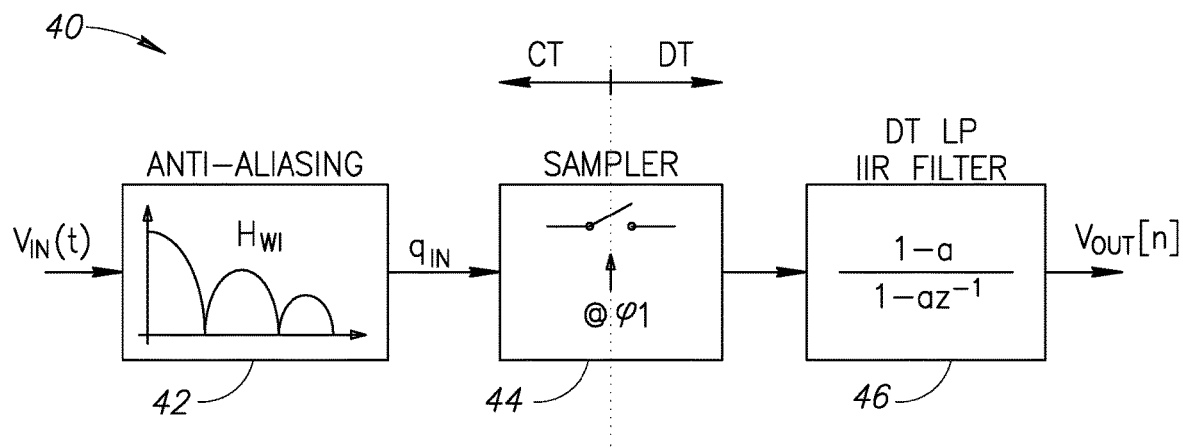
FIG. 7 is a block diagram illustrating a model of charge sampling IIR1.

An example behavioral model of the IIR1 filter incorporating charge sampling is shown in FIG. 7. Integration of the gm-cell current in the time window, as described in (3), forms a CT sinc-type antialiasing filter prior to sampling. The transfer function of this window integration from the input voltage to the output charge is $$H_{WI}(f) = g_m T_s \times \frac{\sin(\pi f T_s)}{\pi f T_s} \qquad (6)$$

This sinc-shape filter has notch frequencies located at $k/T_i$ (k=1, 2, 3, ... ). In this case with ideal clock waveforms, $T_i$ is the same as $T_s=1/f_s$. In a next step, the sampler converts the CT signal to a DT signal and, at the end, a $1^{st}$-order DT LPF preforms the main filtering. As shown in FIG. 8, notch frequencies of the antialiasing filter are on top of the folding image frequencies. Therefore, a signal at these frequencies is attenuated by the CT sinc filter before folding to dc. The dc voltage gain of this filter is calculated by multiplying the dc gain of the antialiasing filter by the dc gain of the DT filter $$A_V = \frac{V_{out}}{V_{in}} = g_m T_i \times \frac{1}{C_S} = g_m \times \frac{1}{C_S f_s}. \qquad (7)$$

In this equation, $1/(C_S f_s)$ is an equivalent DT resistance of the sampling capacitor.

The charge sampling structure has several additional advantages compared to the voltage sampling structure. As discussed, the current integration forms a CT antialiasing filter, which suppresses the folding of images. Also, with the gm-cell used in the charge sampling structure, the filter can have an overall voltage gain higher than unity. In addition, this gm-cell can be designed to lower the overall input-referred noise of the filter. These advantages, however, come at the cost of higher power consumption and lower linearity imposed by the gm-cell.

Figure 10:
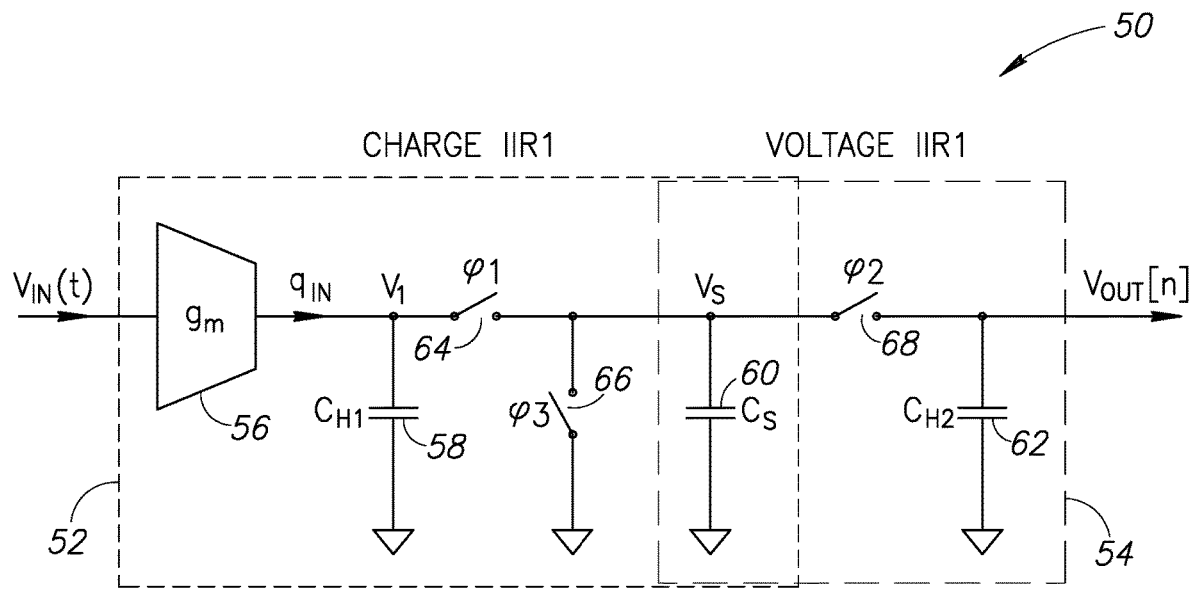
FIG. 10 is a schematic diagram illustrating an example second order discrete time low pass filter.
Figure 11:
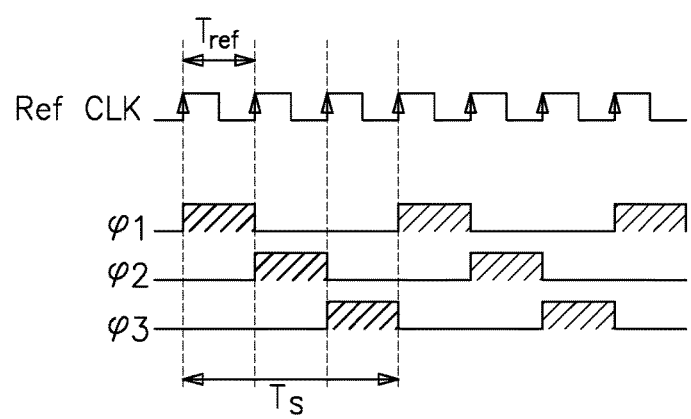
FIG. 11 is a diagram illustrating the clock waveforms of the low pass filter of FIG. 10.

A second-order DT low-pass filter (referred to as IIR2) can be synthesized by adding a second history capacitor to the charge sampling $1^{st}$ order LPF, as shown in FIG. 10. A diagram illustrating the clock waveforms of the low pass filter of FIG. 10 shown in FIG. 11. The previously analyzed charge sampling filter, IIR1, is indicated here within the dotted box 52 incorporating first history capacitor $C_{H1}$. At the end of phase φ1, charge sharing capacitor $C_S$ 60 contains the output sample of the IIR1. Then, by connecting this sampling capacitor to a second history capacitor $C_{H2}$ 62 at phase φ2, another $1^{st}$-order LPF is formed, whose structure is indicated within the dashed box 54 in FIG. 10. This IIR2 filter operates similar to the voltage-sampling IIR1 filter of FIG. 1. Then at phase φ3, remaining history of $C_S$ is cleared by discharging it to ground. This ensures proper operation of the first IIR1.

In this filter, the voltage-sampling IIR1 is cascaded with the charge-sampling one, raising the total order of the filter to the $2^{nd}$ order. It is noted that cascading two CT conventional filter stages without any loading effect would require an active buffer to isolate the first stage from the second stage. In contrast, in the DT filter of FIG. 10 there is an inherent reverse isolation between the stages through a time-slot separation (i.e. time-division duplexing), which does not require a separate active buffer. This is due to the time switching sequence and resetting of $C_S$ at the end of each cycle. In this way, charge is only transferred from left to right and, therefore, reverse isolation is achieved. This is a key feature in the DT switched-capacitor filter synthesis.

Charge sharing equations of this filter at the end of φ2 are $$\begin{cases} V_{out}[n] = \frac{C_{H2}}{C_{H2}+C_S} V_{out}[n-1] + \frac{C_S}{C_{H2}+C_S} V_1\left[n-\frac{1}{3}\right] \\ V_1\left[n-\frac{1}{3}\right] = \frac{C_{H1}}{C_{H1}+C_S} V_1\left[n-\frac{1}{3}-1\right] + \frac{1}{C_{H1}+C_S} q_{in}\left[n-\frac{1}{3}\right] \end{cases} \qquad (8)$$

which generates the filter transfer function $$\frac{V_{out}}{q_{in}} = \frac{1}{C_S} \cdot \left( \frac{1-\alpha_1}{1-\alpha_1 z^{-1}} \times \frac{(1-\alpha_2) z^{-\frac{1}{3}}}{1-\alpha_2 z^{-1}} \right) \qquad (9)$$

where $\alpha_{1,2} = C_{H1,2}/(C_{H1,2}+C_S)$. Hence, the overall dc voltage gain of this filter is given by $$A_V = \frac{V_{out}}{V_{in}} = g_m T_i \times \frac{1}{C_S} = g_m \times \frac{1}{C_S f_s} \qquad (10)$$

which is the same as the charge-sampling IIR1 in (7).

Figure 12:
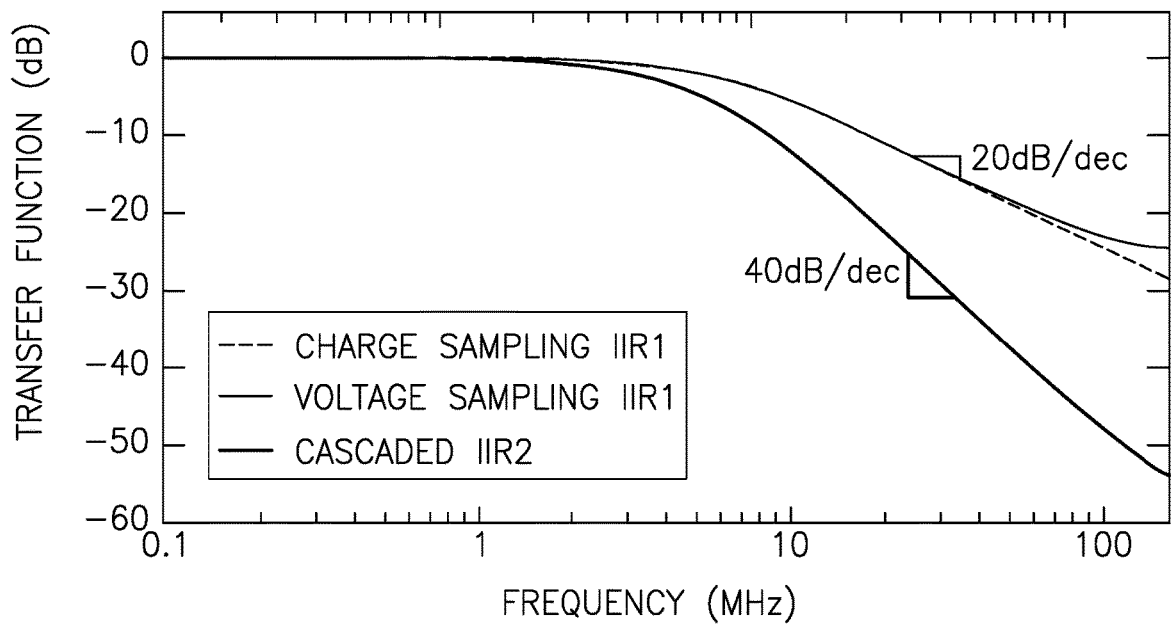
FIG. 12 is a diagram illustrating the frequency response of the IIR2 filter.

The transfer function of this filter is plotted in FIG. 12. The $2^{nd}$ order IIR filter has a steeper slope of 40 dB/dec compared to the IIR1 with 20 dB/dec.

Many applications require higher orders of filtering. One technique is to build a high-order filter by cascading two or more first and/or second-order filters. FIG. 14 shows a $4^{th}$ order filter synthesized by cascading two identical IIR2 filter stages.

Figure 13:
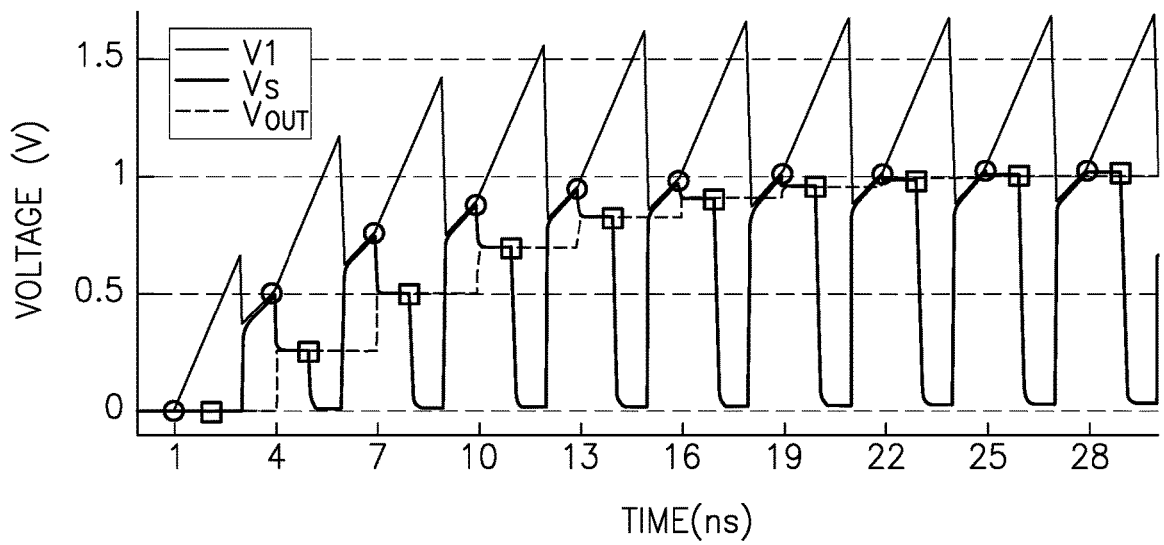
FIG. 13 is a diagram illustrating the step response of the IIR2 filter.

As plotted in FIG. 13, the output of the first IIR2 block 72 has a step-like waveform in the continuous-time domain. $C_{H2}$ 88 in this stage holds its DT output until the next output sample arrives. Hence, we can suppose that the zero-order hold (ZOH) discrete-time to continuous-time converter makes a CT voltage signal at the output of this stage. Then, this signal is converted into current by the second $g_m$ stage 90. This current is integrated over a time window and sampled to form a DT input charge $q_{in}[n]$ of the second IIR2 block 74. This whole process can be modeled as a DT gain with a value of $g_m \times T_s$. Then, the switched-capacitor filter of the second IIR2 preforms another second order filtering and thus we obtain the $4^{th}$ order filter in total.

This structure, however, consumes more power as compared to a single IIR2 filter. Likewise, linearity is worse because nonlinearities of the first and second IIR2 filters are added together. As an example, if the first stage has a gain higher that 0 dB, the input-referred nonlinearity of the second stage is dominant and degrades the total linearity. Similarly, the total input-referred noise of this filter is higher than with a single IIR2. This is due to the fact that both IIR2 filters contribute to noise of the system. If the first stage has a gain higher than 0 dB, however, it reduces the input-referred noise contribution of the second stage.

In another embodiment, the filter order is increased by cascading the IIR2 filter with a passive $1^{st}$ order switched-capacitor filter. FIG. 15 shows this technique in which a $3^{rd}$ order filter, generally referenced 110, is synthesized by cascading the IIR2 block 112 and an IIR1 block 114. This filter operates as follows: At the end of phase φ1, $C_{S1}$ 120 holds the sample of first-order filtered signal. Then at phase φ2, it is connected to $C_{H2}$ 122 to perform charge-sharing. At the same time, a second sampling capacitor $C_{S2}$ 124 that was empty before, is also connected to $C_{H2}$ to resample the result of the second-order filtering. Therefore, $C_{S1}$ shares its charge with both $C_{H2}$ and $C_{S2}$ 124. Subsequently at phase φ3, $C_{S2}$ 124 that contains the sample of the IIR2 112, shares its charge with a third history capacitor $C_{H3}$ 126. This sharing makes another $1^{st}$ order IIR filtering, which is cascaded with the previous IIR2, thus giving rise to the $3^{rd}$ order filtering. To have proper cascading of the IIR2 and IIR1, we require a reverse isolation between them. Hence, at phase φ1 of the next cycle, $C_{S2}$ is discharged to zero to clear its remaining charge. This way, is does not transfer any charge back to $C_{H2}$ at phase φ2. The cascaded $1^{st}$ order filter is indicated with dotted line at the right side of FIG. 15. Note that several of the IIR1 blocks 114 can be cascaded to achieve higher orders. Charge transfer equations of this filter at the end of phase φ3 are as follows $$\begin{cases} V_{out}[n] = \dfrac{C_{H3}}{C_{H3}+C_{S2}} V_{out}[n-1] + \\ \qquad \dfrac{C_{S2}}{C_{H3}+C_{S2}} V_2\left[n-\dfrac{1}{3}\right] \\ V_2\left[n-\dfrac{1}{3}\right] = \dfrac{C_{H2}}{C_{H2}+C_{S1}+C_{S2}} V_2\left[n-\dfrac{1}{3}-1\right] + \\ \qquad \dfrac{C_{S1}}{C_{H2}+C_{S1}+C_{S2}} V_1\left[n-\dfrac{2}{3}\right] \\ V_1\left[n-\dfrac{2}{3}\right] = \dfrac{C_{H1}}{C_{H1}+C_{S1}} V_1\left[n-\dfrac{2}{3}-1\right] + \dfrac{1}{C_{H1}+C_{S1}} q_{in}[n] \end{cases} \quad (11)$$

Then we can derive the transfer function as $$\begin{aligned} \frac{V_{out}}{q_{in}} &= \left(\frac{1}{C_{S1}} \times \frac{1-\alpha_1}{1-\alpha_1 z^{-1}}\right) \cdot \left(\frac{C_{S1}}{C_{S1}+C_{S2}} \times \frac{(1-\alpha_2)z^{-\frac{1}{3}}}{1-\alpha_2 z^{-1}}\right) \cdot \\ &\quad \left(\frac{(1-\alpha_3)z^{-\frac{1}{3}}}{1-\alpha_3 z^{-1}}\right) \\ &= \frac{1}{C_{S1}+C_{S2}} \cdot \left(\frac{1-\alpha_1}{1-\alpha_1 z^{-1}} \times \frac{1-\alpha_2}{1-\alpha_2 z^{-1}} \times \frac{1-\alpha_3}{1-\alpha_3 z^{-1}} \times z^{-\frac{2}{3}}\right) \end{aligned} \quad (12)$$

where $$\alpha_1 = \frac{C_{H1}}{C_{H1}+C_{S1}},\ \alpha_2 = \frac{C_{H2}}{C_{H2}+C_{S1}+C_{S2}},\ \alpha_3 = \frac{C_{H3}}{C_{H3}+C_{S2}} \quad (13)$$

The main drawback of this structure is gain loss. Comparing this $3^{rd}$ order filter with the IIR2, there is a lower dc gain because of the second sampling capacitor $C_{S2}$. It leaks part of the system charge to ground in addition to the resetting of $C_{S1}$ and, therefore, introduces more loss. Comparing (9) and (12) reveals a dc gain difference of these two structures. Input-referred noise of this structure is also higher versus that of IIR2. Firstly, because of extra noise of the IIR1 part in FIG. 14. Secondly, because of the lowered gain of its preceding stage. In contrast, linearity of the filter is almost the same because the switched-capacitor circuit cascaded with IIR2 is extremely linear compared to the gm-cell active circuitry. Hence, it does not significantly degrade the linearity.

The above reasoning makes it apparent that extending the IIR filter order using a conventional approach carries two serious disadvantages: First, the increased reset-induced charge loss lowers the gain and signal-to-noise ratio. Second, the active buffers between the stages worsen both the noise and the linearity. An alternative embodiment incorporating charge rotation is presented infra that does not suffer from these two handicaps.

Figure 16:
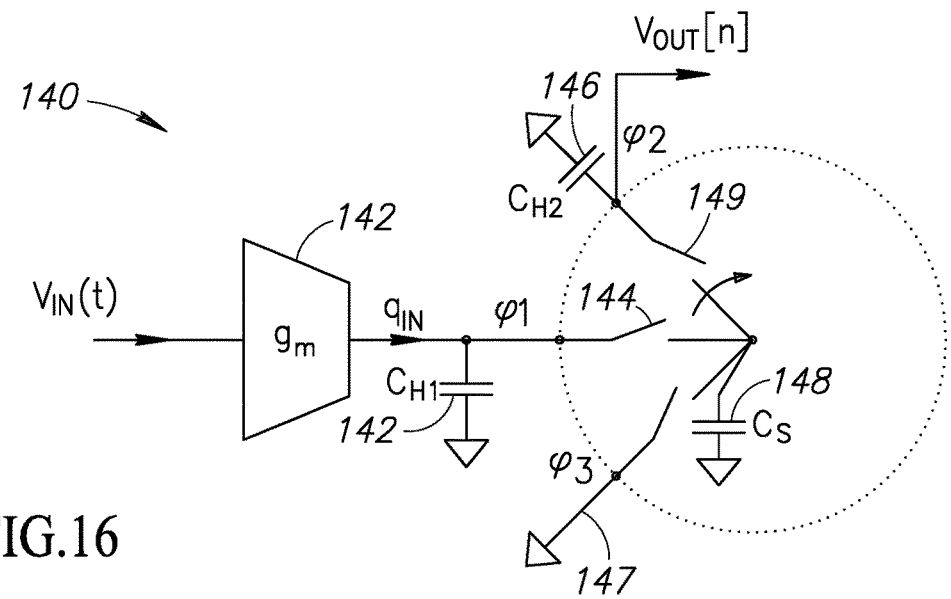
FIG. 16 is a schematic diagram illustrating the IIR2 redrawn.

Before introducing the high-order filter embodiment, the IIR2 block is redrawn in FIG. 16. Switches 144, 149 are shown. Also, $C_S$ 148 is placed at the center of the (incomplete) circle. In each cycle, $C_S$ "rotates" clockwise and sequentially connects to $C_{H1}$ 142, $C_{H2}$ 146 and then ground 147. As described earlier, at the end of phase φ1, $C_S$ holds a sample of first order filter. Then, at the next phase, i.e. phase φ2, $C_S$ shares its charge with the second history capacitor $C_{H2}$. At the end of this phase, the output sample of the $2^{nd}$ order IIR filter on $C_{H2}$ is ready for readout. At the same time, we have the output sample of this IIR2 on $C_S$. It is important to note that we can maintain this sample on $C_S$ for further processing before finally resetting it at the end of the entire cycle (i.e. phase φ3 in this example).

Figure 17:
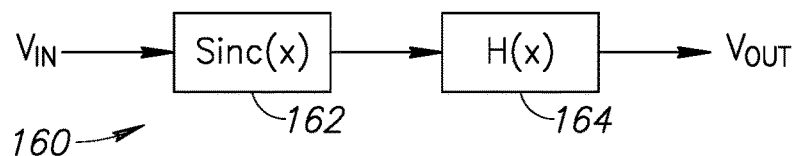
FIG. 17 is a diagram illustrating a transfer function of an example IIR filter.

A diagram illustrating a transfer function of an example IIR filter is shown in FIG. 17. The filter, generally referenced 17, comprises a sinc(x) block 162 and H(x) block 164.

Figure 18:
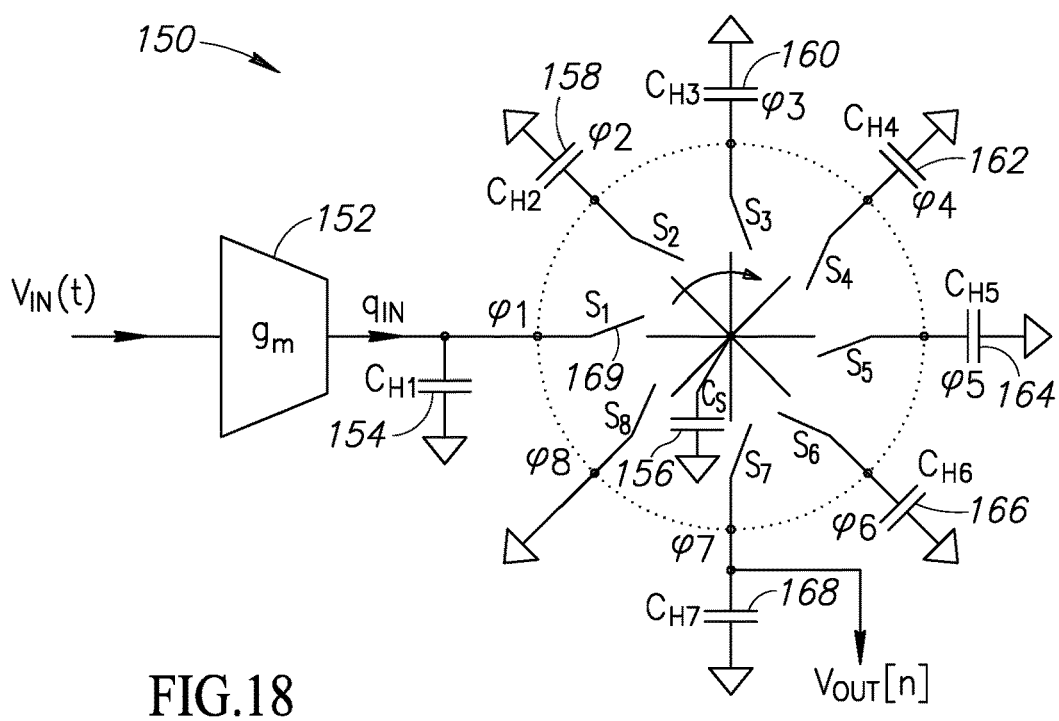
FIG. 18 is a diagram illustrating a first example charge rotating $7^{th}$ order filter.

The technique above can be extended by using multiple phases to control the switches in a rotating fashion. Thus, one or more phase slots between phase φ2 and the last reset phase are added, together with additional associated history capacitors. An example high-order filter structure ($7^{th}$ order) is shown in FIG. 18. By moving to the next new phase, i.e. phase φ3, $C_S$ 156 which now holds the sample of the $2^{nd}$ order filter, shares its charge with a third history capacitor $C_{H3}$. This charge sharing creates another IIR1, cascaded with the previous IIR2. Hence, we have a $3^{rd}$ order filtering function on $C_{H3}$ 160 that can be read out at the end of phase φ3. Again, $C_S$ contains the sample of this $3^{rd}$ order filter at the end of this phase. Next, by continuing with phase φ4, $C_S$ shares its charge with $C_{H4}$ 162 creating yet another IIR1. The $4^{th}$ order output is available for readout at the end of phase φ4. We can continue doing so until the seventh history capacitor $C_{H7}$ 168 resulting in a $7^{th}$ order filter. One may continue adding phases and history capacitors to realize higher orders.

Figure 19:
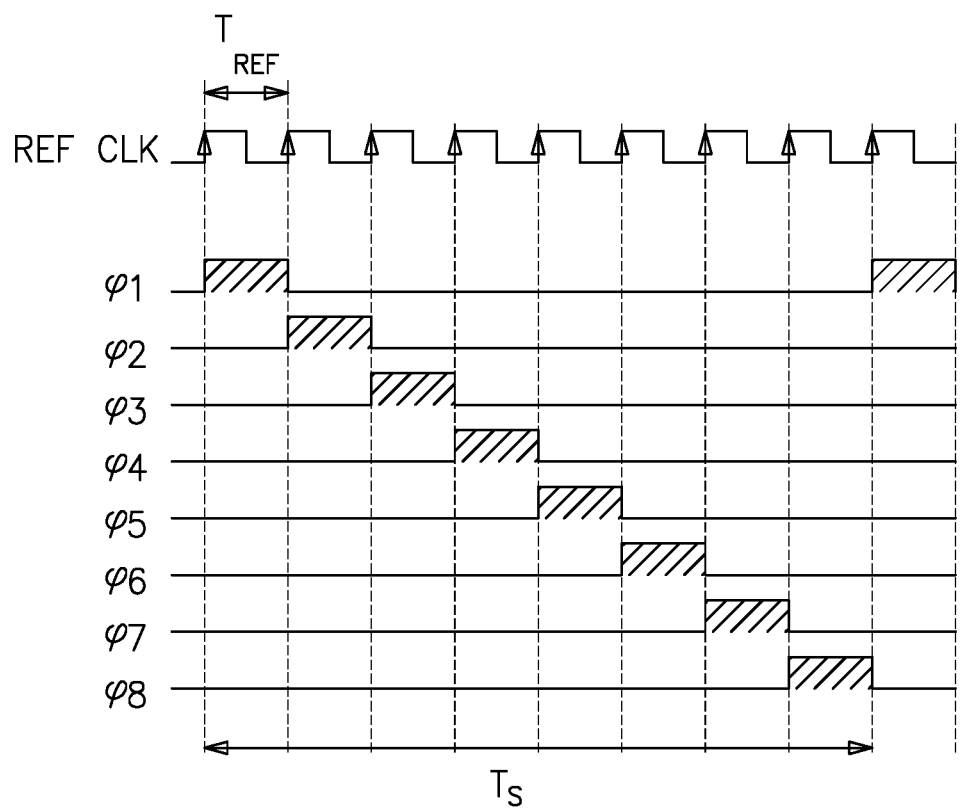
FIG. 19 is a diagram illustrating the clock waveforms of the filter of FIG. 17.

In the last phase φ8, $C_S$ is finally connected to ground to empty its remaining charge. Thus, it is ready for the next complete cycle. Since the $C_S$ capacitor rotates charge between the history capacitors, this structure is referred to as a "charge rotating" discrete time filter. Each of the history capacitors can be considered an output of the filter with different orders. The output with the highest order $C_{H7}$, however, is typically used ($C_{H7}$ in this example). As shown in FIG. 19 the required multi-phase clock waveforms to drive the switches can be generated from a reference clock.

Appropriate cascading of seven $1^{st}$ order IIR filters in this structure requires reverse isolation between them. This reverse isolation is provided by rotating $C_S$ located at the center of the structure only in one direction (i.e. clockwise here). Also, the resetting phase at the end of each cycle is necessary to prevent transferring charge from the last stage $C_{H7}$ to the first stage at the next cycle.

Compared to the IIR2 structure in FIG. 10, the charge rotating (CR) structure preserves its gain, linearity and noise even at much higher orders. In contrast with the $3^{rd}$ order filter in FIG. 15, the charge rotating IIR filter preserves the same DC gain as IIR2 even at the $7^{th}$ order configuration (i.e. IIR7). This is simply because no additional charge loss occurs in the system. Similar as in IIR2, it has only one lossy component, the $C_S$ capacitor that is reset once each cycle.

The switched capacitor charge rotating structure circuit is remarkably linear and thus the $g_m$ cell appears to be a bottleneck of the linearity. Since the $g_m$ cell used in the charge rotating IIR7 is the same as in IIR2, the linearity is almost the same. Also, the charge rotating filter has the same noise as IIR2 which is discussed in more detail infra.

Figure 20:
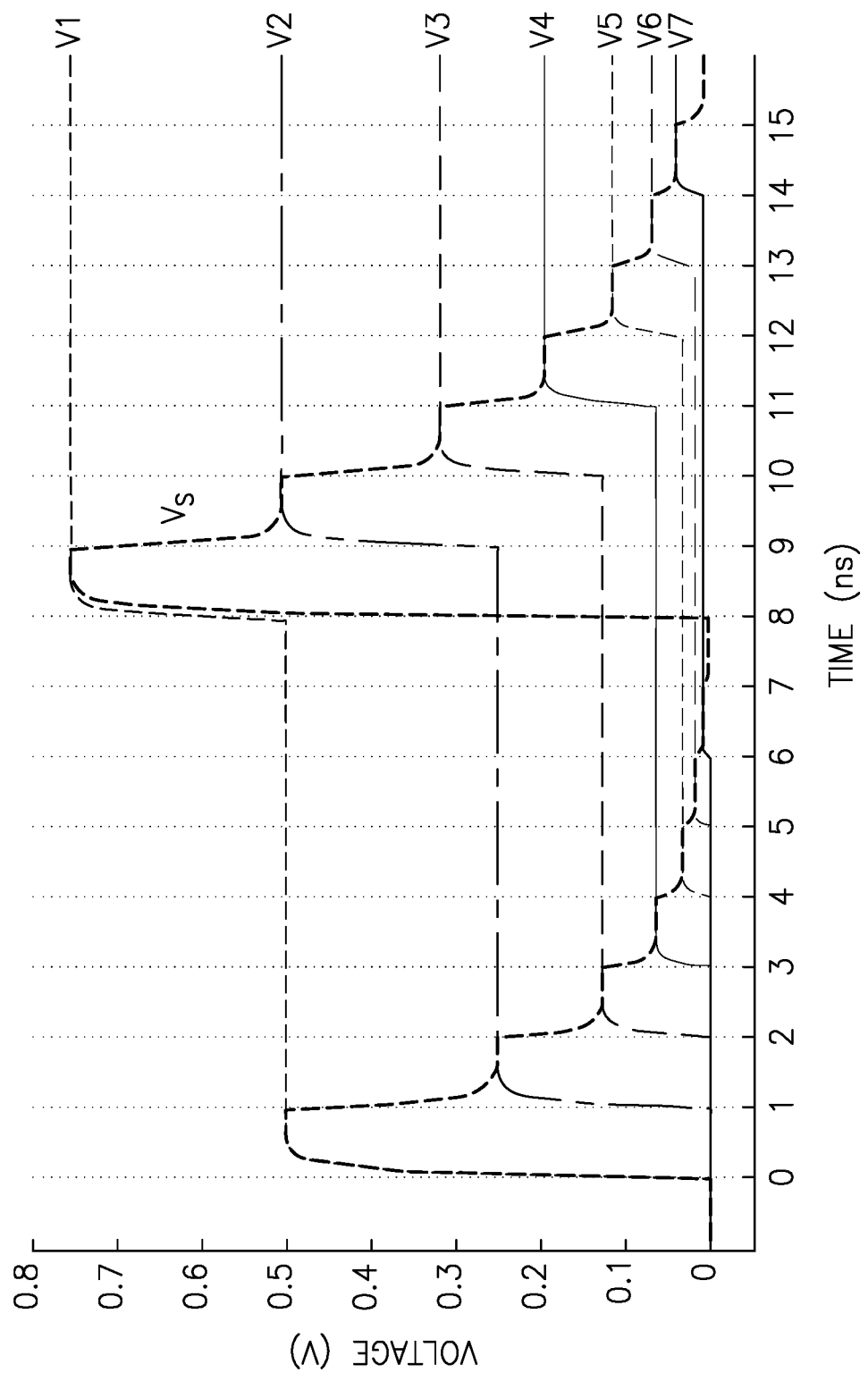
FIG. 20 is a diagram illustrating the step response of the charge rotating IIR7 filter in more detail.
Figure 21:
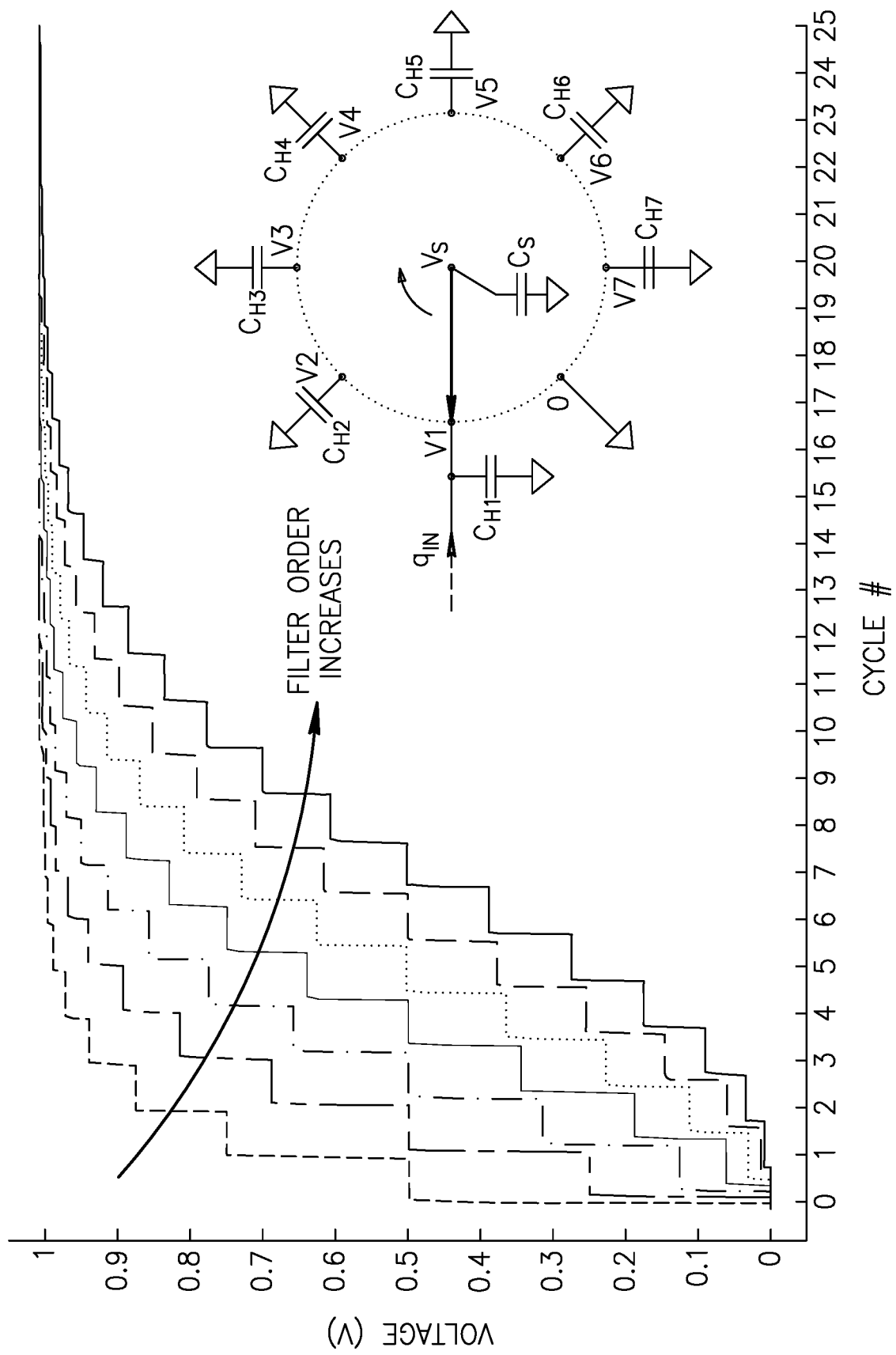
FIG. 21 is a diagram illustrating the whole step response of the charge rotating IIR7 filter.

To aid in understanding the operation of the charge rotating filter, its step response is plotted in FIGS. 20 and 21. At first, suppose that all the capacitors are empty of charge. For simplicity, we choose $C_S = C_H = 1$ pF. Also, we suppose that the input charge packet $q_{in}[n] = 1$ pC arrives every cycle at phase $\varphi 1$. A zoom-in of the step response is plotted in FIG. 20. With reference also to FIG. 18, at phase $\varphi 1$, the input charge is transferred to both $C_{H1}$ and $C_S$ that sets the 0.5 V potential on both of them. $C_S$ that has the sample of $1^{st}$ order filter is then connected to $C_{H2}$ at phase $\varphi 2$. The result is 0.25V on both capacitors. Next at $\varphi 3$, $C_S$ with the sample of $2^{nd}$ order filter is connected to $C_{H3}$ and the result is 0.125V. In this way, $C_S$ transfers charge from one history capacitor to the next until $C_{H7}$. Then, it gets reset at phase $\varphi 8$. As shown in FIG. 20, outputs of stages with higher orders are growing more slowly. This is because their respective input sample has been accumulated several times before, meaning slower but longer and smoother integration. As plotted in FIG. 21, however, all of the outputs converge to 1V at steady state.

To derive the DT transfer function (TF) of this filter, we need to first obtain its charge sharing equations. Considering that samples of the main output $V_{out} = V_7$ are ready at the end of phase $\varphi 7$ we have $$\begin{cases} @ \varphi 7: V_7[n] = \frac{C_{H7}}{C_{H7} + C_S} V_7[n-1] + \frac{C_S}{C_{H7} + C_S} V_6\left[n - \frac{1}{8}\right] \\ @ \varphi 6: V_6\left[n - \frac{1}{8}\right] = \frac{C_{H6}}{C_{H6} + C_S} V_6\left[n - \frac{1}{8} - 1\right] + \frac{C_S}{C_{H6} + C_S} V_5\left[n - \frac{2}{8}\right] \\ \vdots \\ @ \varphi 2: V_2\left[n - \frac{5}{8}\right] = \frac{C_{H2}}{C_{H2} + C_S} V_2\left[n - \frac{5}{8} - 1\right] + \frac{C_S}{C_{H2} + C_S} V_1\left[n - \frac{6}{8}\right] \\ @ \varphi 1: V_1\left[n - \frac{6}{8}\right] = \frac{C_{H1}}{C_{H1} + C_S} V_1\left[n - \frac{6}{8} - 1\right] + \frac{1}{C_{H1} + C_S} q_{in}\left[n - \frac{6}{8}\right] \end{cases} \quad (14)$$

In these equations, each $-\frac{1}{8}$ means one phase delay. At phase $\varphi 7$, $V_7$ is a function of its value at previous cycle ($-1$ delay) and a sample $V_6$ that comes from the previous phase ($-\frac{1}{8}$ delay). Likewise, charge sharing equations from phase $\varphi 1$ to phase $\varphi 6$ are derived. Converting all these equations into Z-domain, we can derive the following general equation for different outputs $$H_k(z) = \frac{V_k}{q_{in}} = \frac{1}{C_S} \cdot z^{-\frac{k-1}{8}} \cdot \prod_{i=1}^{k} \frac{1 - \alpha_i}{1 - \alpha_i z^{-1}}, \quad (15)$$

for $k = 1, 2, \ldots, 7$. In this equation, $\alpha_i = C_{H,i}/(C_{H,i} + C_S)$. Normally, we prefer to have all the poles identical and so we choose all the capacitors to have the same size $C_{H1-7} = C_H$. Then the transfer function of the main output (i.e. $V_7$) is simplified to the following $$H(z) = \frac{V_{out}}{q_{in}} = \frac{1}{C_S} \cdot z^{-\frac{6}{8}} \cdot \left(\frac{1 - \alpha}{1 - \alpha z^{-1}}\right)^7. \quad (16)$$

Inside the parenthesis is a $1^{st}$ order low-pass TF with unity gain. Also, $z^{-6/8}$ is a delay of six phases. Based on this equation, dc gain of $V_{out}$ to input charge, $q_{in}$, is $1/C_S$. Then, by using Equation 7, the overall dc gain of this filter from input voltage to its output is $$A_V = \frac{V_{out}}{V_{in}} = g_m T_i \times \frac{1}{C_S} = g_m \times \frac{1}{C_S f_s}. \quad (17)$$

In this equation, $T_i = T_s$ is the time period of the cycle extending over the eight phases. The second part of this equation $1/(C_S f_s)$ is an equivalent dc resistance of the sampling capacitor that is reset $f_s$ times per second. This filter has the same DC voltage gain as the IIR2 filter in (10).

For frequencies much lower than $f_s$, we can use the well-known bilinear transform to obtain the continuous-time transfer function of the filter $$\frac{V_k(s)}{V_{in}(s)} = A_V \times \frac{1}{\left(1 + \frac{1}{C_S f_s} \cdot C_H \cdot s\right)^k}. \quad (18)$$

This equation is similar to a transfer function of an RC LPF, i.e. $1/(1 + RC_S)$, with $-3$ dB bandwidth of $1/(RC)$. Note that the poles of this equation are all located at $s = C_S f_s / C_H$. This indicates that the bandwidth of the filter only depends on the ratio of sampling and history capacitors and the sampling frequency. Since the capacitor ratio has a very low variation, the bandwidth of this filter is insensitive to PVT.

Figure 22:
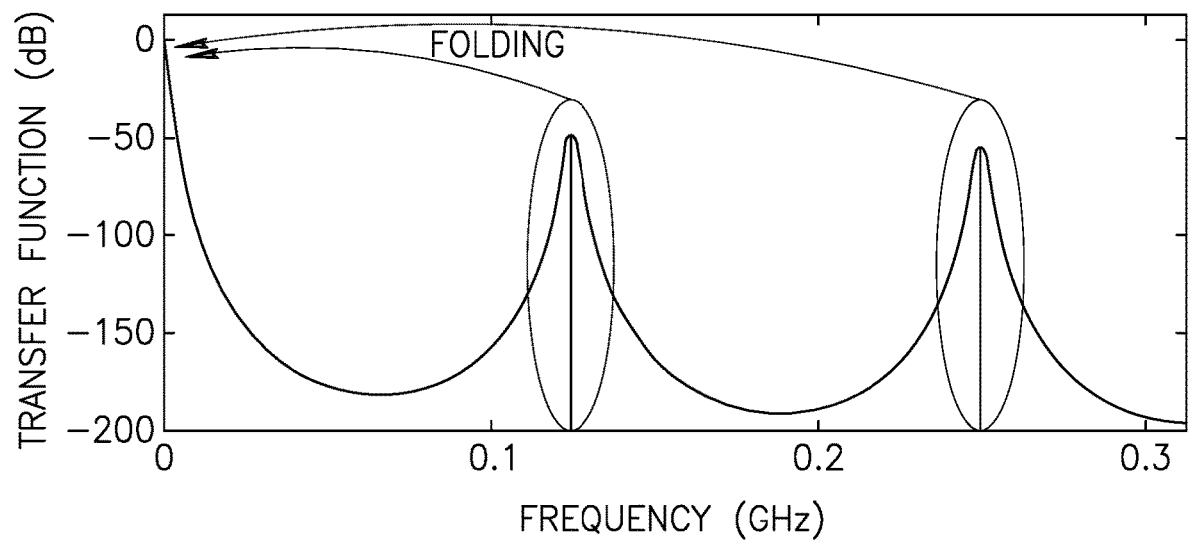
FIG. 22 is a diagram illustrating the wideband transfer function of the charge rotating IIR7 filter.
Figure 23:
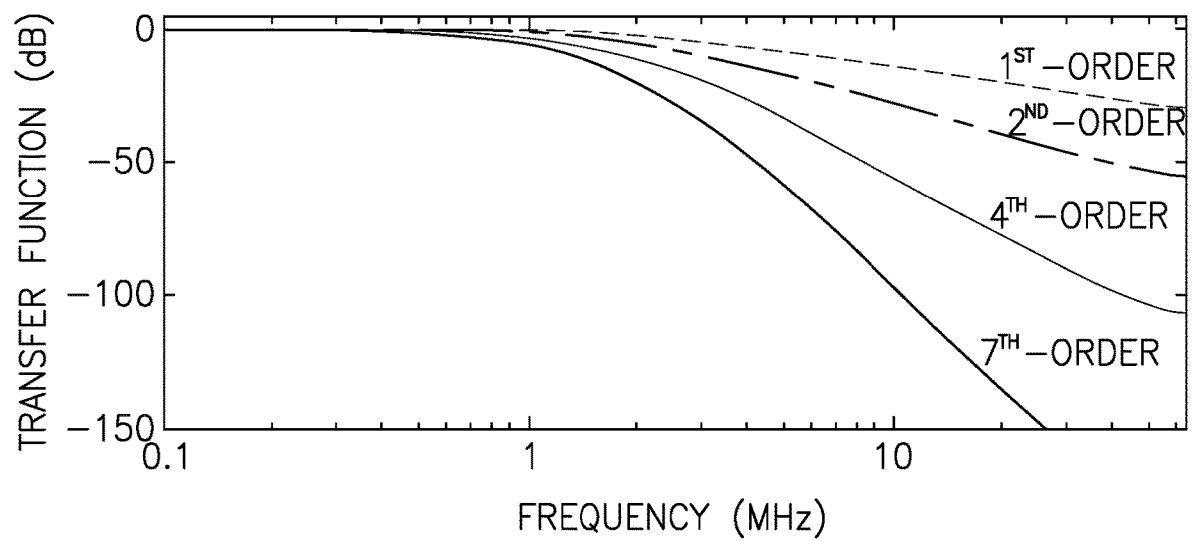
FIG. 23 is a diagram illustrating the Bode plot frequency response of the charge rotating IIR7 filter.

The wideband transfer function of this filter is plotted in FIG. 22. The antialiasing filter attenuates signals around $f_s$, $2f_s$, ... before the sampling folds them to dc. Also, the transfer functions of outputs with different orders are shown in FIG. 23. By going from $1^{st}$ order output to the $2^{nd}$ order output, the filtering slope increases from 20 dB/dec to 40 dB/dec. By going to $4^{th}$ order output, the slope increases to 80 dB/dec. Finally, roll-off of the $7^{th}$ order output transfer function of this filter reaches 140 dB/dec.

This filter has seven real poles but no complex conjugate poles. Therefore, transition between the flat pass-band frequency and the sharp filtering roll-off in FIG. 23 happens rather smoothly, whereas a sharp transition sometimes might be preferred. This sharp transition can be exploited in Butterworth and Chebyshev types of filters. The smooth transition band in the charge rotating IIR7 filter, however, appears acceptable for many applications. For example, a baseband channel-selection filter of an RF receiver is usually followed by an ADC. In that case, the smooth transition band can be fully compensated downstream in the digital domain processing by an equalizer.

Since the sampling capacitor $C_S$ rotates one turn per cycle, the sampling rate is the same as the cycling frequency. Also, the output rate of this filter is the same as the sampling rate, meaning no decimation occurs in the filter. In an example embodiment, each multi-phase cycle of this filter comprises eight phases, and, therefore, the sampling frequency $f_s$ is $f_{ref}/8$. For example, with a reference clock frequency of 1 GHz, the sampling rate is 125 MS/s. Considering the limited rejection of the antialiasing filter formed by the current integration, the filter aliases to dc some amount of signal at frequencies around $k \times f_s$ ($k = 1, 2, 3 \ldots$), inside pass-band of the filter (see FIG. 22).

To avoid the aliasing, a higher sampling rate can be used. In addition, to have good stop-band rejection in discrete time filters the sampling rate is preferably several times higher than the desired bandwidth.

Operation of the charge rotating IIR7 filter such as shown in FIG. 18 can be considered as eight different stages in series. As new data arrives at phase φ1 it is sequentially processed at each stage until phase φ8. Then the next data sample arrives. In this way, we have not used the full capacity (data rate) of each stage. For example, while the data is being processed at phase φ7 to evaluate the $7^{th}$ order output, other capacitors, $C_{H1}$ to $C_{H6}$, are unused awaiting a new sample. As we have history capacitors $C_{H1-7}$ holding the data between different stages, while having no data dependency of preceding stages on succeeding stages (i.e. no feedback) we are able to readily increase the data rate of this filter by incorporating a pipelining technique.

All the above results and equations are valid and extendable to higher order filters, e.g., the charge rotating IIR7 discussed supra. Note that if a pipelining technique is used to increase the sampling rate of the filter, all the above equations remain the same except that the new sampling frequency should be used.

In one embodiment, the high-order charge-rotating (CR) DT filter comprises a $g_m$ cell, switches, capacitors and a waveform (i.e. multiple clocks) generator circuit. Therefore, it is compatible with digital nanoscale CMOS technology. Implementing the filter in a finer process reduces the area of the capacitors, switches and the waveform generator while maintaining the same performance. In fact, the filter circuit scales down with Moore's law. In addition, by switching from one process node to the next, its performance improves where we have faster switches, capacitors with higher density, higher $g_m$ values and a faster or lower power waveform generator digital circuit. Hence, this architecture is amenable to deep nanoscale CMOS technology. Bandwidth of the filter is accurate and, as described in Equation 18, is set by the capacitor ratio and clock frequency. In CMOS processes, the capacitor ratio has the lowest PVT variation if the same type of capacitors is used.

A key feature of this filter eliminates any need for calibration which is necessary for many prior art filter types. Due to the fast switches with low "on" resistance coupled with use of pipelining, the filter of the present invention has an ultra-high sampling rate (in range of GS/s). Hence, unwanted aliasing is avoided or minimized. The DT high-order filter also exhibits ultra-low noise. This is due to an absolute minimum number of noisy components (i.e. the $g_m$ cell and switched-capacitor network). Also, as described supra, the noise of the switched-capacitor network does not accumulate at higher orders. The use of a single lossy component to realize seven poles substantially reduces the noise of the switched-capacitor circuit compared to seven cascaded RC filters. Since the switched-capacitor portion of this filter is extremely linear, the filter achieves good linearity with careful design of the $g_m$ cell.

Figure 24:
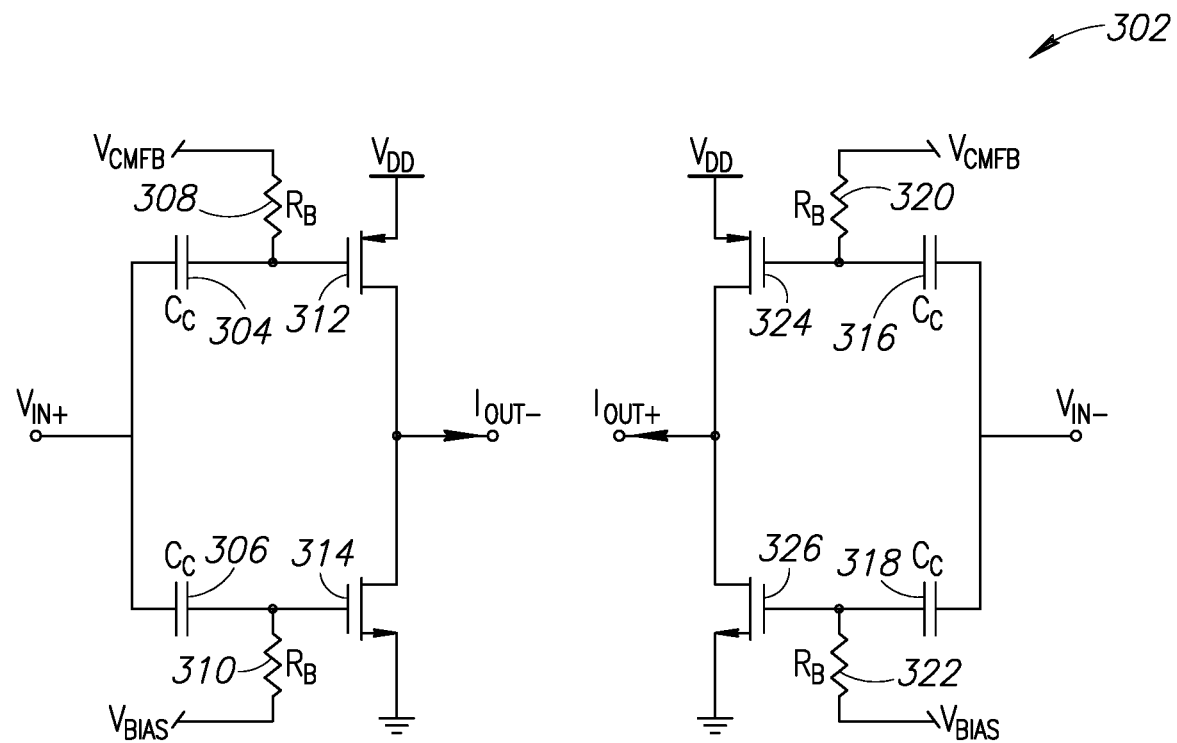
FIG. 24 is a schematic diagram illustrating an inverter based pseudo-differential $g_m$ cell.

Since a key feature of the filter of the present invention is the amenability to process scaling, a simple inverter-based gm-cell is used which is shown in more detail in FIG. 24. In this pseudo-differential $g_m$ cell, generally referenced 302, a bias voltage $V_{bias}$ comes from a diode-connected NMOS and mirrors a bias current into the $g_m$ cell. Also, a common-mode feedback circuit sets common-mode output voltage to $V_{DD}/2$ by adjusting $V_{CMFB}$. The simplicity of this gm-cell allows us to scale it smaller using finer processes.

Coupling capacitors $C_C$ 306, 304, 316, 318 and bias resistors $R_B$ 308, 310, 320, 322 of this $g_m$ cell set a lower limit of frequency response. In most cellular applications, a low limit frequency exists such that information whose spectrum is lower than this is not important. In this embodiment, $C_C$ and $R_B$ are chosen to be as large as possible. They set a low limit frequency of a few kHz for the filter. If such a limit is not acceptable for the particular application, then other gm-cell architectures well-known in the art can be used. Alternatively, the filter in the voltage-sampling mode can be used as it passes frequencies down to dc. As the limited output resistance of this gm-cell may affect the filtering operation of the switched-capacitor network, we have tried to increase it to several times higher than the equivalent dc resistance of the SC circuit.

Despite using a simple inverter-based $g_m$ cell, the $g_m$ cell provides good linearity. By adjusting NMOS and PMOS transistor sizes as well as bias current and providing a low enough resistance (by the SC circuit) at its output, a high IIP3 is obtained.

Regarding the Cc capacitors of this filter, MOS capacitors with high density are preferably used. It is not possible, however, to use them differentially. Using a differential capacitor has the advantage of reducing the required capacitance and area by four times compared to using two single-ended capacitors. Hence, in one embodiment standard metal-oxide-metal (MoM) capacitors are used that can be implemented differentially. The history capacitors $C_{H1-7}$ range from 0.5-to-128 pF digitally selectable using eight bits. To converse area, they have been implemented differentially. For the filter sampling capacitors, MoM capacitors are used such that they can be well matched with the history capacitors. This reduces variations due to PVT as compared to the case of using two different types of capacitors. The sampling capacitors $C_S$ range from 0.75 to 4.5 pF digitally selectable using four bits. Here, instead of implementing $C_S$ differentially, they are implemented single ended. We can then set the common-mode voltage of the filter by terminating $C_S$ to $V_{CM}$ instead of ground. This voltage matches the output common-mode voltage of the gm-cell and is chosen to be $V_{DD}/2$. To adjust the bandwidth of the filter, $C_S$ is fixed and $C_H$ is changed. In this manner, gain and linearity of the circuit does not change. Also, if the sampling frequency is changed, we change $C_S$ inversely to maintain the same bandwidth and gain.

Discrete-time output data of the chip has a step-like waveform in the continuous-time domain. In other words, it appears as a ZOH continuous-time signal at the output. Hence, the output signal can be directly measured and evaluated without any other required conversion.

Note that in conventional IIR filtering, the current (i.e. charge) is integrated over a time window $T_i = 1/f_s$ and sampled as a DT charge packet. The window integration acts like a zero-order hold (ZOH) which forms a continuous-time (CT) sinc(x) antialiasing filter, shown in FIGS. 17 and 18. DT data is then low passed filtered by passive switched capacitor circuits in which the order of filtering can be increased by adding additional phases and history capacitors ($C_H$) as described supra.

Figure 25:
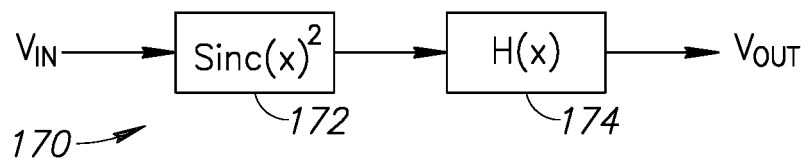
FIG. 25 is a diagram illustrating a transfer function of a $sinc^2$ based second order antialiasing IIR filter.

A diagram illustrating a transfer function of a $sinc^2$ based second order antialiasing IIR filter is shown in FIG. 25. Considering an IIR filter 174, conceptually ZOH is replaced with first-order hold (FOH) whose frequency response is the $sinc(x)^2$ function 172. This improves the filter's stop band rejection resulting in more attenuation of unwanted signals folded from multiples of the sample frequency $f_s$. In practice, however, the realization of a linear interpolation is very complex. In one embodiment, a rectangular boxcar T is convolved with itself to yield a triangle response whose transfer function is sinc(x)². This technique, however, needs to use an additional $g_m$ cell to convert the voltage to current for providing the second boxcar which consumes more power.

In another embodiment, an IIR filter has been proposed which takes benefit advantage of second order antialiasing filtering, consequently stop band rejection improves more than 20 dB.

Figure 28:
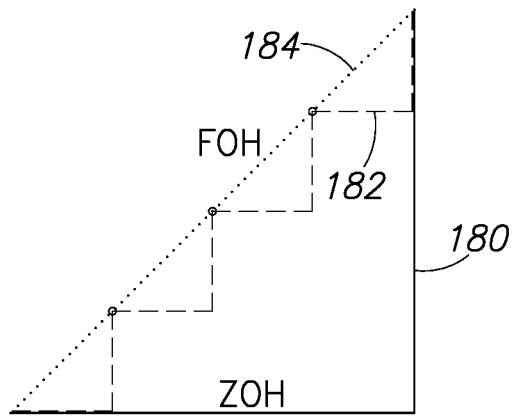
FIG. 28 is a diagram illustrating first order hold (FOH) pseudo-linear multi-stepped charge transfer operation versus zero order hold (ZOH)

In a charge-based architecture, if the charge is more uniformly distributed instead of being transferred instantly to the output through the entire sampling period, the output voltage increases more linearly over time as shown in FIG. 28 which shows a ZOH 180 versus stepped FOH 182 which approximates a linear line 184.

Figure 26:
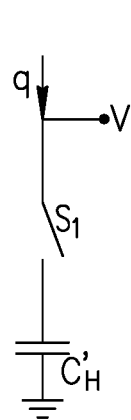
FIG. 26 is a diagram illustrating an example of a switching history capacitor.
Figure 27:
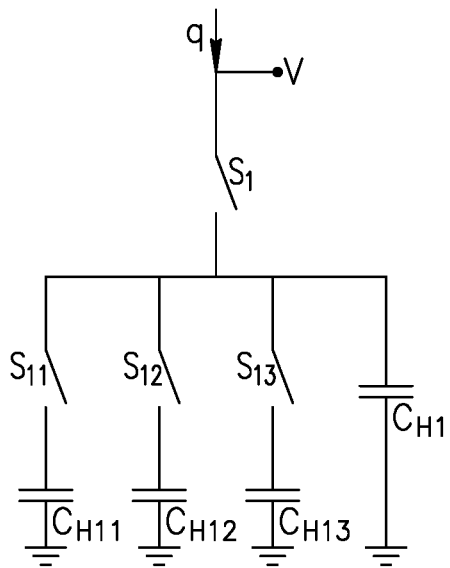
FIG. 27 is a diagram illustrating an example history capacitor implemented as a bank of capacitors in parallel with a history capacitor in accordance with the present invention.

Considering an example of a switching history capacitor shown in FIG. 26, if the size of history capacitor $C_H'$ increases gradually during the sampling period, a sinc(x)² transfer function will be achieved. A diagram illustrating an example history capacitor implemented as a bank of capacitors in parallel with a history capacitor in accordance with the present invention is shown in FIG. 27. In this example, four history capacitors are shown, with three ($C_{H11}$, $C_{H12}$, $C_{H13}$) in series with switches $S_{11}$, $S_{12}$, $S_{13}$, respectively, and a fourth $C_{H1}$ being non-switched. The capacitor array is in series with switch $S_1$ which controls the flow of charge to the array. In one embodiment, the middle effective capacitance value (e.g., $C_{H1}+1.5\ C_{H11}$) of the four array capacitors is equivalent to that of $C_H'$ without the use of the array (e.g., FIG. 18, 26) when all three array switches are sequentially closed. The values of the three capacitors $C_{H11}$ $C_{H12}$ $C_{H13}$ may be equal or different depending on the particular implementation.

Figure 29:
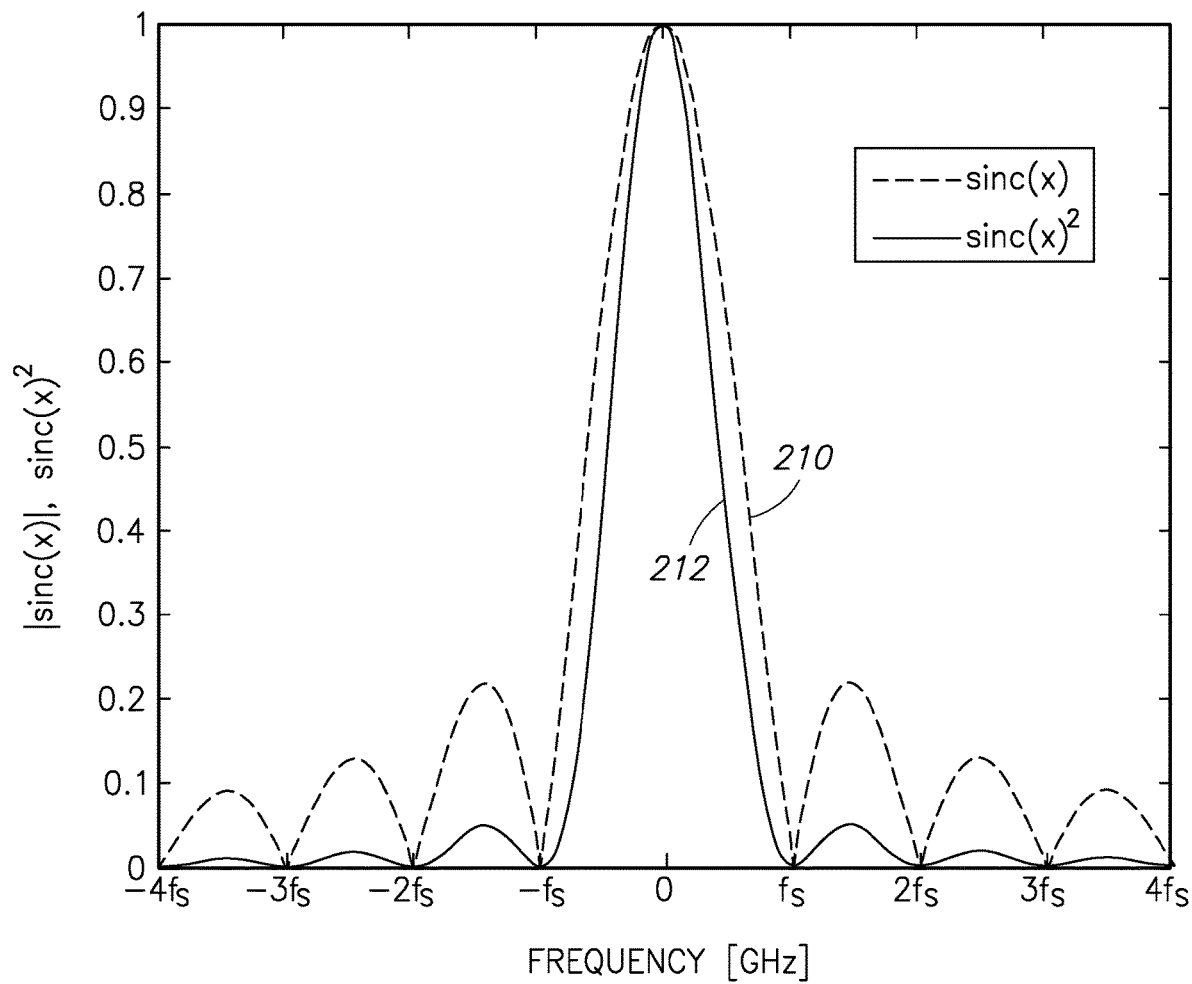
FIG. 29 is a diagram comparing a $sinc(x)^2$ transfer function with a $sinc(x)$ transfer function.

The charge is not delivered to the output uniformly, however, it is conveyed in multiple steps (e.g., four steps in this example as shown in FIG. 28) at a fraction of the sampling period, similar to L-fold linear interpolation. The antialiasing transfer function is close to sinc(x)² for values of L above two. It is noted that the sampling frequency is still $f_s$. In other words, transmitting the charge at the higher rate in this case does not imply oversampling the input signal. A diagram illustrating sinc(x)² transfer function 212 and sinc(x) transfer function 210 is shown in FIG. 29.

Figure 30:
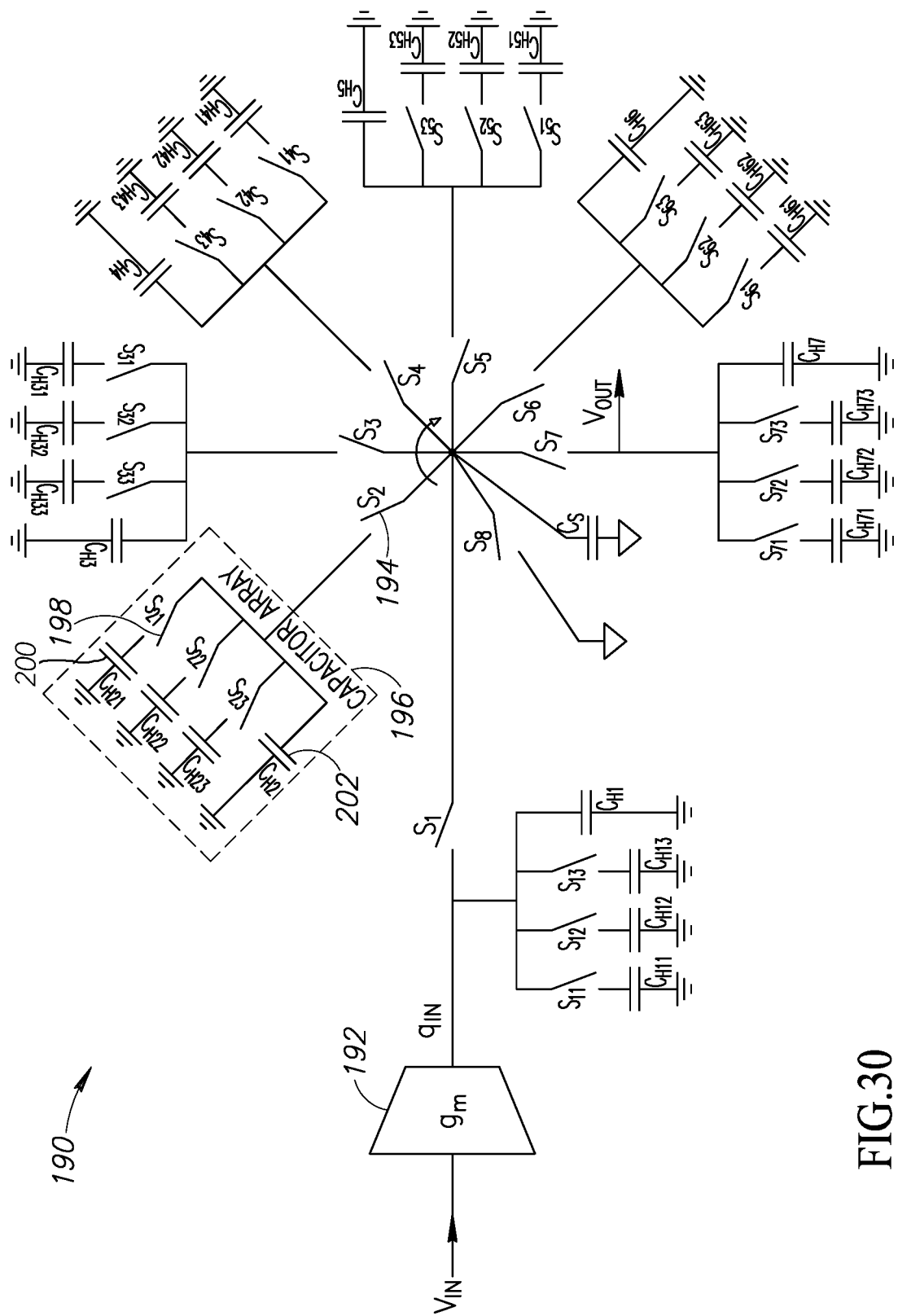
FIG. 30 is a diagram illustrating a second example charge rotating $7^{th}$ order filter having $sinc(x)^2$ transfer function and incorporating banks of history capacitors in accordance with the present invention.

A diagram illustrating a second example charge rotating $7^{th}$ order filter incorporating banks of history capacitors in accordance with the present invention is shown in FIG. 30. The architecture of the IIR filter, generally referenced 190, comprises a $g_m$ cell 192, a plurality of switches 194 each in series with a history capacitor array 196. In this example embodiment, each capacitor array 196 comprises a parallel combination of history capacitors 200 coupled in series with switches 198, and a non-switched history capacitor 202. The IIR filter 190 is based on the charge rotating technique described in detail supra. The input signal is converted to current by the $G_m$ cell 192. The current is then integrated in the history capacitors arrays 196 and shared with the sampling capacitor $C_S$. In this example, there are seven history capacitor arrays associated with seven switches $S_1$, $S_2$, ..., $S_7$, respectively. Each switch is associated with a different history capacitor array. During each phase, the sampling capacitor shares the charge with other history capacitor arrays. Finally, in the last (i.e. eighth) phase the $C_S$ is reset via switch $S_8$. Since this structure is reset once per cycle, the noise performance is better than other structures.

Figure 31:
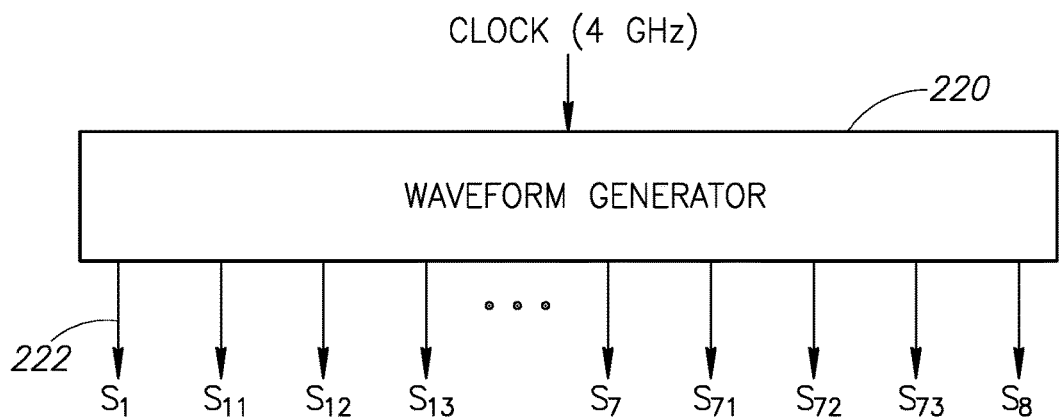
FIG. 31 is a diagram illustrating an example waveform generator.

A diagram illustrating an example waveform generator is shown in FIG. 31. In this example, the waveform generator 220 received a 4 GHz clock input and is operative to generate the plurality of switch signals 222 $S_i$, $S_{i1}$, $S_{i2}$, $S_{i3}$, namely $S_1$, $S_{11}$, $S_{12}$, $S_{13}$, $S_2$, $S_{21}$, $S_{22}$, $S_{23}$, etc.

Figure 33:
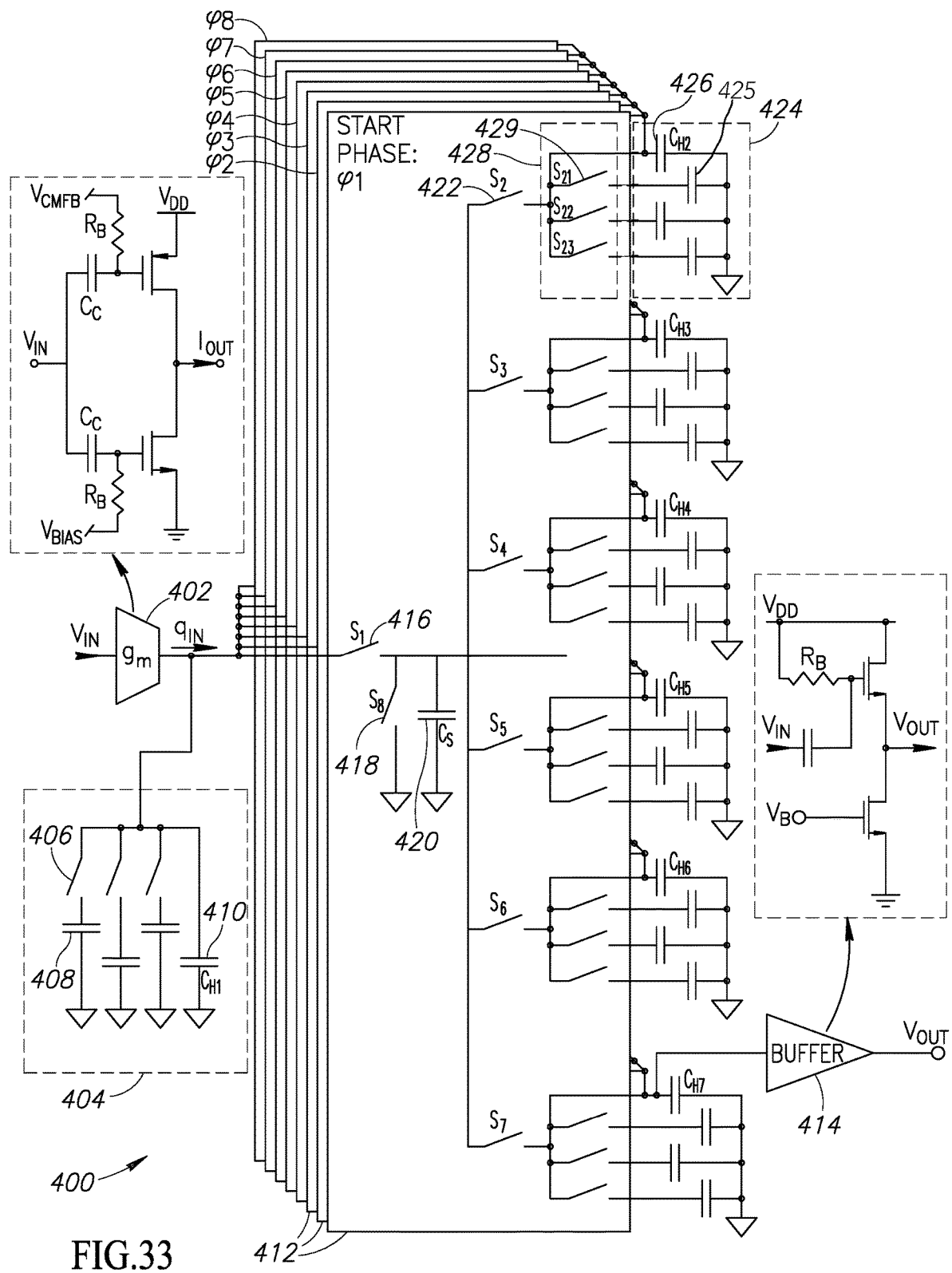
FIG. 33 is a schematic diagram illustrating an example full rate charge rotating IIR7 low pass filter using pipelining.

Note that in one embodiment, the discrete time filter is differential, which works in both current mode and voltage mode. The $g_m$ cell 402 is an inverter-based amplifier as shown in FIG. 33 wherein common mode feedback sets its output voltage to $V_{DD}/2$. To provide all required multi-phase clock signals the input sinewave at 4 GHz is injected to the clock generator circuitry 220. The input buffer of the clock generator provides the required square wave signals for the waveform generator.

Figure 32A:
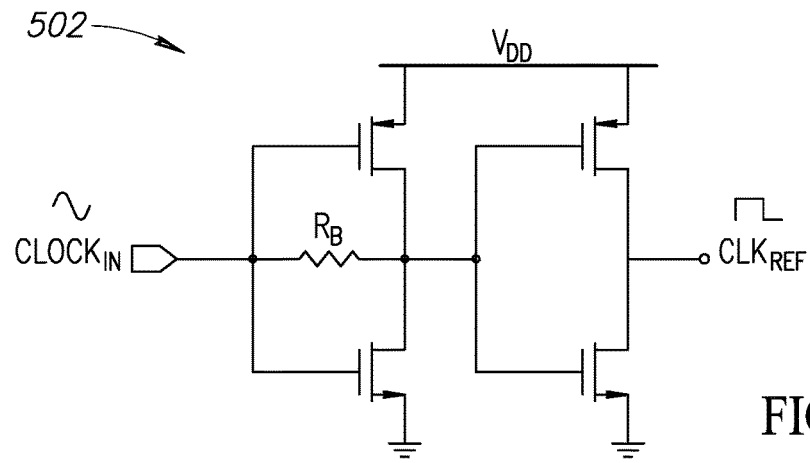
FIG. 32A is a diagram illustrating an example reference clock generator circuit.
Figure 32B:
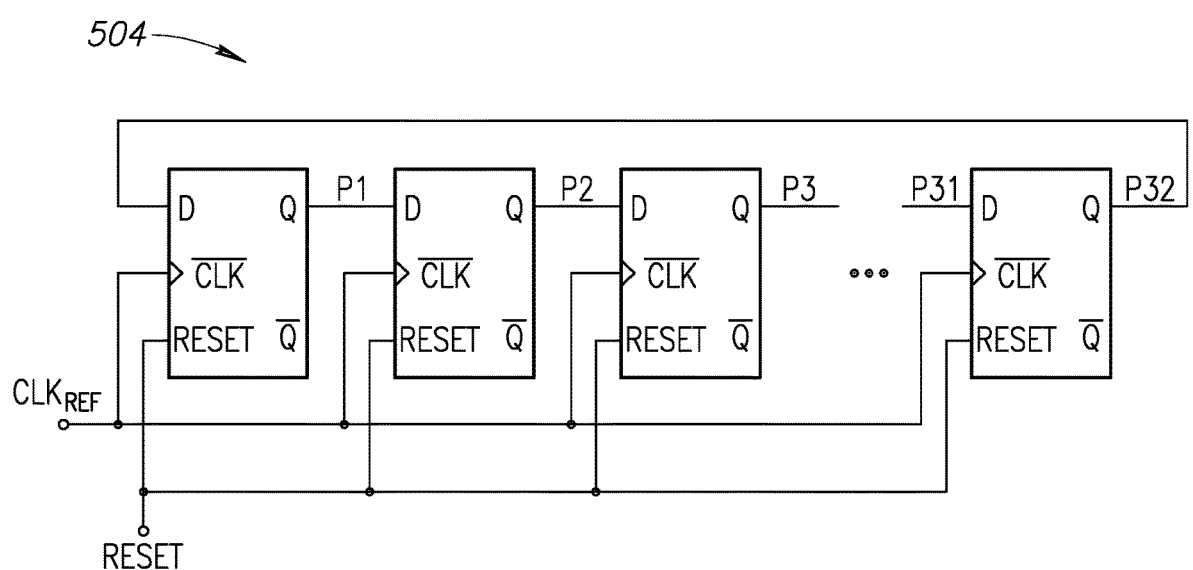
FIG. 32B is a diagram illustrating an example phase generator circuit.

A diagram illustrating an example reference clock generator circuit is shown in FIG. 32A. The $CLK_{Ref}$ generator circuit, generally referenced 502 takes a sine wave input signal and converts it to a square wave output signal. A diagram illustrating an example multi-phase clock generator circuit is shown in FIG. 32B. The phase generator circuit, generally referenced 504, comprises a plurality of flip flops connected in daisy chain fashion. In an example embodiment, the phase generator comprises 32-bit phase registers connected back to back to each other and operative to generate 32 phase signals, i.e. P1 to P32. The output of the last flip flop stage is fed back to the input of the first stage. A reset signal sets 80000000 hex in the registers and then it starts rotating synchronously to the reference clock signal. By using nonoverlapping circuits, the required clock signals are aligned and connected to the gate of the switches. The output of the filter is input to a buffer 414 to generate an output $V_{OUT}$ signal which can drive 50 ohm downstream circuitry, for example.

Figure 32C:
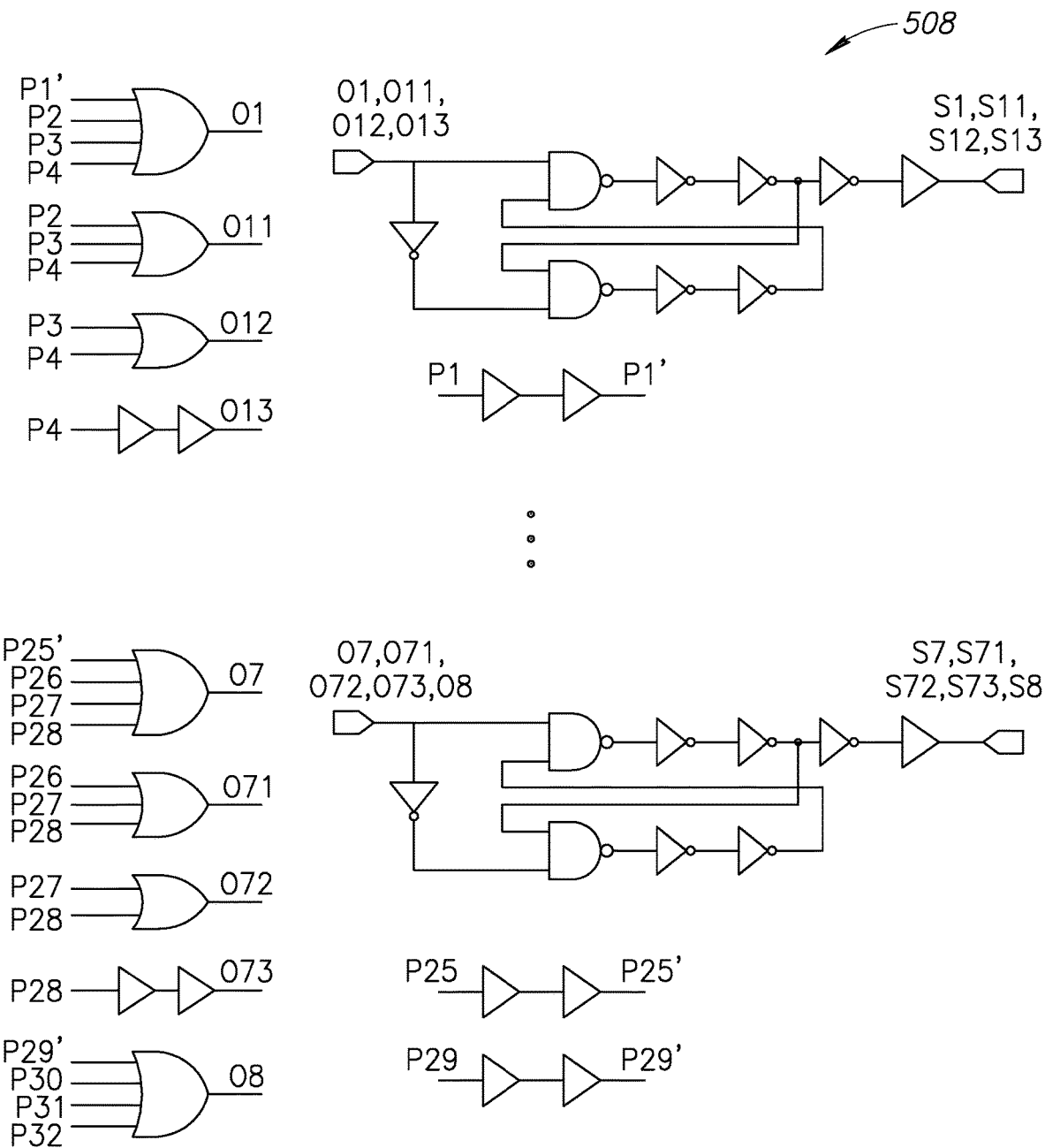
FIG. 32C is a diagram illustrating an example clock waveform generation circuit.
Figure 32D:
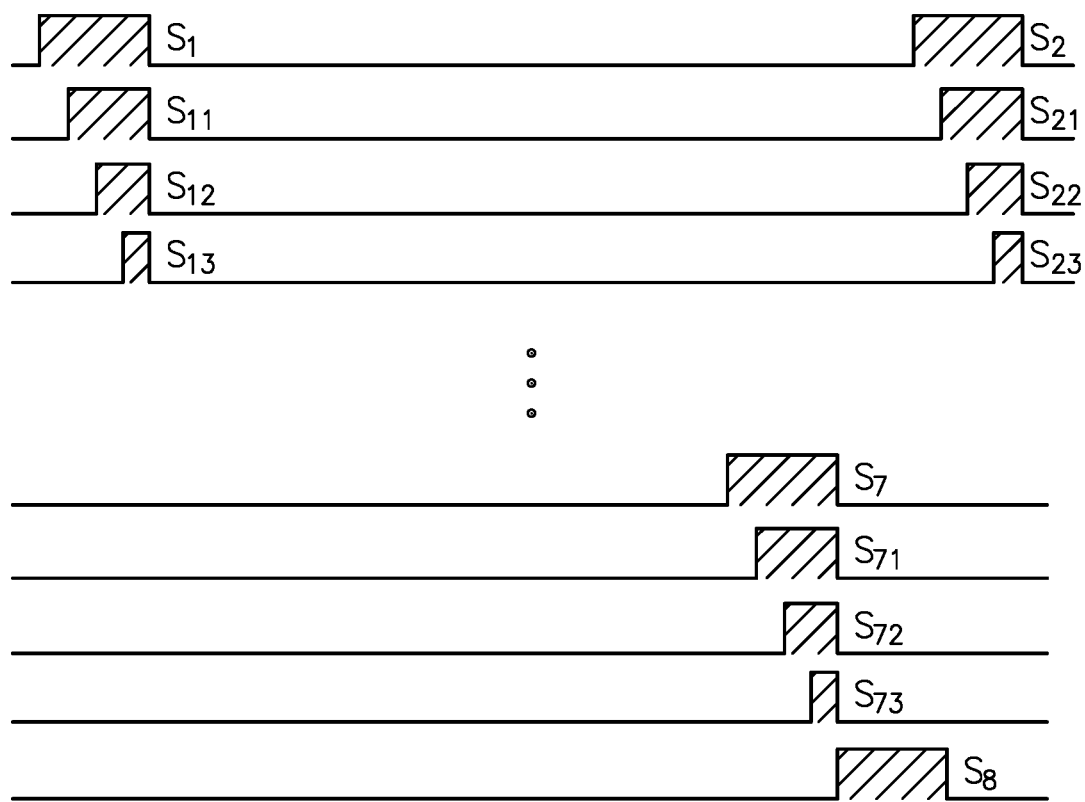
FIG. 32D is a diagram illustrating generated clock waveforms.

A diagram illustrating an example clock waveform generation circuit is shown in FIG. 32C. The nonoverlapping circuit, generally referenced 508, comprises the logic elements for generating the switching signals $S_1$, $S_{11}$, $S_{12}$, etc. A diagram illustrating the generated clock waveforms is shown in FIG. 32D. The resulting waveforms comprise main clock phases for each switch $S_1$, $S_2$, $S_3$, etc. Each clock phase is divided into sub-phases, i.e. intervals lasting shorter than the full cycle, one for each switch in the history capacitor array. i.e. $S_{11}$, $S_{12}$, $S_{13}$, for switch $S_1$, and so on. In one embodiment, each clock phase is divided into quarters whereby clock sub-phase $S_{11}$ is delayed one quarter cycle, clock sub-phase $S_{12}$ phase is delayed two quarters, and clock sub-phase $S_{13}$ is delayed three quarters of a cycle from the beginning of $S_1$. Thus, at the end of the $S_i$ phase, all switchable capacitors are connected in the history capacitor array and combined with the non-switched history capacitor $C_{Hi}$. The capacitance of each history capacitor array is a maximum at this point.

Thus, in each phase $S_i$ the capacitance of the bank of history capacitors is increased gradually over the multiple sub-phases, $S_{i1}$, $S_{i2}$, and $S_{i3}$ during the sampling frequency which results in very high out of band rejection compared to the filter of FIG. 18. Moreover, the bandwidth of the filter which is defined by the ratio of $C_H/C_S$ and the sampling frequency is tunable. High stop band rejection and bandwidth tuneability makes this architecture amenable for 5G applications.

A schematic diagram illustrating an example full rate charge rotating IIR7 low pass filter using pipelining is shown in FIG. 33. The filter, generally referenced 400, comprises $g_m$ cell 402, history capacitor array 404 and a bank of switches 412 coupled to capacitor arrays 424. The history capacitor array 404 comprises non-switched capacitor $C_{H1}$ 410 and a bank of parallel switches 406 coupled in series to history capacitors 408. Each bank of switches 412 comprises switch $S_1$ 416, reset switch $S_8$ 418, non-switched sampling capacitor $C_S$ 420, switches 422, namely $S_2 \ldots S_7$, each coupled to a bank of switches 428 that include switches 429, namely $S_{i1}$, $S_{i2}$, $S_{i3}$. The bank of switches 428 in each switch bank 412 is connected to a respective array of history capacitors 424 located outside the switch banks 412 and shared therewith, where each array 424 comprises a parallel combination of history capacitors 425 connected in series to switches 429, and a non-switched history capacitor 426. The starting phase of each switch bank 412 is different, with the first switch bank starting with phase one, the second switch bank starting with phase two, and so on to the eighth phase.

With reference to the filter of FIG. 30, the input is sampled once per cycle which leads to the sampling frequency of $f_s = f_{clk}/8$. Consequently, the frequency folding occurs at lower frequency. To take advantage of the full rate sampling and to increase the sampling frequency to $f_{clk}$, in this example, eight banks of sampling capacitors and switches connected to the same history capacitor arrays.

It is noted that the sampling capacitor $C_S$ in FIG. 18 is connected to only one of the eight nodes ($C_{H1-7}$ and GND) at each phase. Now, however, instead of only one $C_S$, we have eight sampling capacitors with each of them connected to one of the nodes. Then, by going to the next phase all of them are moving to the next node in the clockwise direction. At each new phase of this pipeline structure new data ($q_{in}$) arrives and is filtered on the first history capacitor array 404, new data is transferred from the first array to the second array (i.e. $C_{H1}$ to $C_{H2}$) and filtered, from $C_{H2}$ to $C_{H3}$ and so on until $C_{H7}$, and the sampling capacitor is then reset to ground. Therefore, considering the entire filter, there is no difference between the different phases. At each phase, new data is input and new data is output (via array $C_{H7}$ and buffer 414). For each sampling capacitor $C_S$ and its rotation network, a separate switch bank is used.

In this circuit, the sampling frequency $f_s$ is the same as $f_{ref}$ which is eight times higher than previously. Charge sharing equations for this filter are as follows.

$$V_7[n] = \frac{C_{H7} + C_{H71} + C_{H72} + C_{H73}}{C_{H7} + C_{H71} + C_{H72} + C_{H73} + C_S} V_7[n-1] + \tag{19}$$

$$\frac{C_S}{C_{H7} + C_{H71} + C_{H72} + C_{H73} + C_S} V_6[n-1] +$$

$$\frac{C_{H7} + C_{H71} + C_{H72}}{C_{H7} + C_{H71} + C_{H72} + C_S} V_7[n-1/4] +$$

$$\frac{C_{H7} + C_{H71}}{C_{H7} + C_{H71} + C_S} V_7[n-2/4] + \frac{C_{H7}}{C_{H7} + C_S} V_7[n-3/4]$$

$$V_6[n] = \frac{C_{H6} + C_{H61} + C_{H62} + C_{H63}}{C_{H6} + C_{H61} + C_{H62} + C_{H63} + C_S} V_6[n-1] +$$

$$\frac{C_S}{C_{H6} + C_{H61} + C_{H62} + C_{H63} + C_S} V_5[n-1] +$$

$$\frac{C_{H6} + C_{H61} + C_{H62}}{C_{H6} + C_{H61} + C_{H62} + C_S} V_6[n-1/4] +$$

$$\frac{C_{H6} + C_{H61}}{C_{H6} + C_{H61} + C_S} V_6[n-2/4] + \frac{C_{H6}}{C_{H6} + C_S} V_7[n-3/4]$$

$$\vdots$$

$$V_2[n] = \frac{C_{H2} + C_{H21} + C_{H22} + C_{H23}}{C_{H2} + C_{H21} + C_{H22} + C_{H23} + C_S} V_2[n-1] +$$

$$\frac{C_S}{C_{H2} + C_{H21} + C_{H22} + C_{H23} + C_S} V_1[n-1] +$$

$$\frac{C_{H2} + C_{H21} + C_{H22}}{C_{H2} + C_{H21} + C_{H22} + C_S} V_2[n-1/4] +$$

$$\frac{C_{H2} + C_{H21}}{C_{H2} + C_{H21} + C_S} V_2[n-2/4] + \frac{C_{H2}}{C_{H2} + C_S} V_2[n-3/4]$$

$$V_1[n] = \frac{C_{H1} + C_{H11} + C_{H12} + C_{H13}}{C_{H1} + C_{H11} + C_{H12} + C_{H13} + C_S} V_1[n-1] +$$

$$\frac{C_{H1} + C_{H11} + C_{H12}}{C_{H1} + C_{H11} + C_{H12} + C_S} V_1[n-1/4] +$$

$$\frac{C_{H1} + C_{H11}}{C_{H1} + C_{H11} + C_S} V_1[n-2/4] + \frac{C_{H1}}{C_{H1} + C_S} V_1[n-3/4] +$$

$$\frac{1}{C_{H1} + C_{H11} + C_{H12} + C_{H13} + C_S} q_{in}[n] +$$

$$\frac{1}{C_{H1} + C_{H11} + C_{H12} + C_S} q_{in}[n-1/4] +$$

$$\frac{1}{C_{H1} + C_{H11} + C_{H12} + C_S} V_1[n-2/4] + \frac{1}{C_{H1} + C_S} q_{in}[n-3/4]$$

Then, the transfer function of this filter is given by the following.

$$H_k(z) = \frac{V_k}{q_{in}} \tag{20}$$

$$= \frac{(\beta_0 + \beta_1 z^{-1/4} + \beta_2 z^{-2/4} + \beta_3 z^{-3/4})}{C_S} z^{-(k-1)} \prod_{i=1}^{k} \frac{1 - \alpha_i}{1 - \alpha_i z^{-1} - \alpha_{i1} z^{-1/4} - \alpha_{i2} z^{-2/4} - \alpha_{i3} z^{-3/4}}$$

where $$\beta_0 = \frac{1}{C_{H1} + C_{H11} + C_{H12} + C_{H13} + C_S} \tag{21}$$

$$\beta_1 = \frac{1}{C_{H1} + C_{H11} + C_{H12} + C_S}$$

$$\beta_2 = \frac{1}{C_{H1} + C_{H11} + C_S}$$

$$\beta_3 = \frac{1}{C_{H1} + C_S}$$

$$\alpha_i = \frac{C_{Hi} + C_{Hi1} + C_{Hi2} + C_{Hi3}}{C_{Hi} + C_{Hi1} + C_{Hi2} + C_{Hi3} + C_S}$$

$$\alpha_{i1} = \frac{C_{Hi} + C_{Hi1} + C_{Hi2}}{C_{Hi} + C_{Hi1} + C_{Hi2} + C_S}$$

$$\alpha_{i2} = \frac{C_{Hi} + C_{Hi1}}{C_{Hi} + C_{Hi1} + C_S}$$

$$\alpha_{i3} = \frac{C_{Hi}}{C_{Hi} + C_S}$$

for k=1, 2, . . . , 7. This is the same as Equation 16 except that the delay has been changed. Also, dc voltage gain of the full-rate IIR7 is the same as Equation 17. Note that here $f_s$ is increased to $f_{ref}$.

The IIR filter of the present invention incorporating history capacitor arrays has been implemented in 28 nm CMOS technology. Both $C_S$ and $C_H$ are implemented as MoM capacitors. $C_S$ is a 3-bit binary controlled capacitor which varies between 0.5 and 4.5 pF. The capacitors $C_{Hi}$ and $C_{Hi1}$, $C_{Hi2}$, $C_{Hi3}$, in each array are also tunable from 0.5 pF to 128 pF by using a 6-bit binary code. Moreover, the filter operates at 1.05 V power supply voltage and consumes 0.65 mW DC total power in which the $g_m$ cell and waveform generator drain 0.25 mA and 0.4 mA current, respectively. Finally, the power consumption of the output buffers is 2 mW which is not included in the power budget of the filter.

Figure 34:
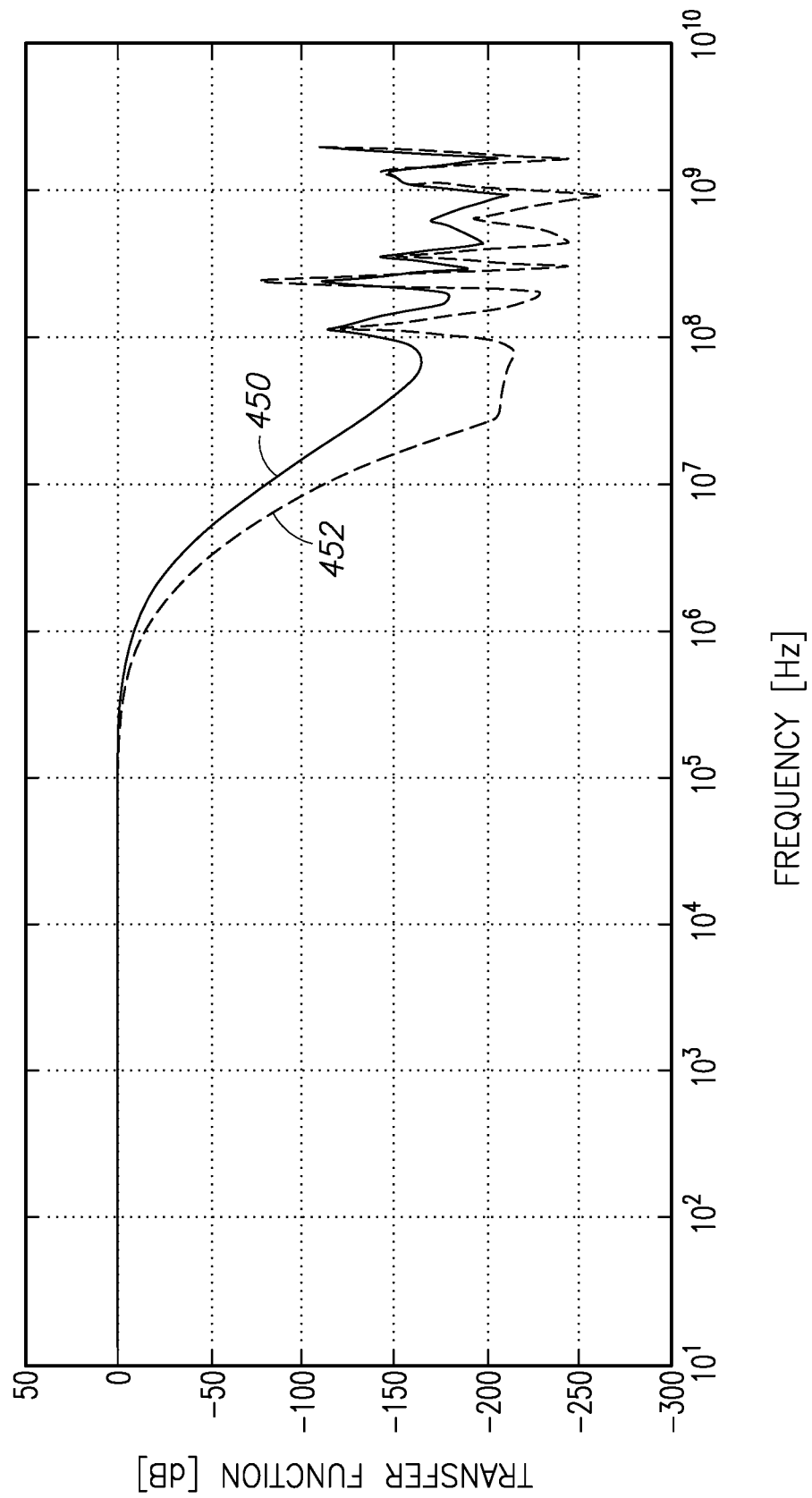
FIG. 34 is a diagram illustrating a transfer function of a gain normalized $7^{th}$ order discrete time IIR filter incorporating banks of history capacitors.

A diagram illustrating a transfer function of a gain normalized 7th order discrete time IIR filter incorporating banks of history capacitors is shown in FIG. 34. The final total capacitance in each array is 9 pF, i.e. with all switches on. By increasing the history capacitor gradually, the stop band rejection improves more than 20 dB for the highest history capacitor value. The best stop band rejection testing equipment permits measurement of is better than 120 dB for 400 kHz BW.

In-band simulated IIP3 and IIP2 of the filter is derived using two tones test at 1 MHz and 1.1 MHz are +16 dBm and +57 dBm respectively.

In the current mode, the flicker noise of $g_m$ cell is dominated in lower frequency while in the higher frequency, its thermal noise has the most influence on noise performance of the circuit which is shaped by the filter transfer function. The average input referred noise in the BW is 8.5 nV/(Hz)$^{1/2}$ in this design mainly because of the noise of $g_m$ cell. It is noted that the $g_m$ cell is not optimized in the example embodiments presented herein. Optimizing the $g_m$ cell would lower the input referred noise (IRN).

Figure 35:
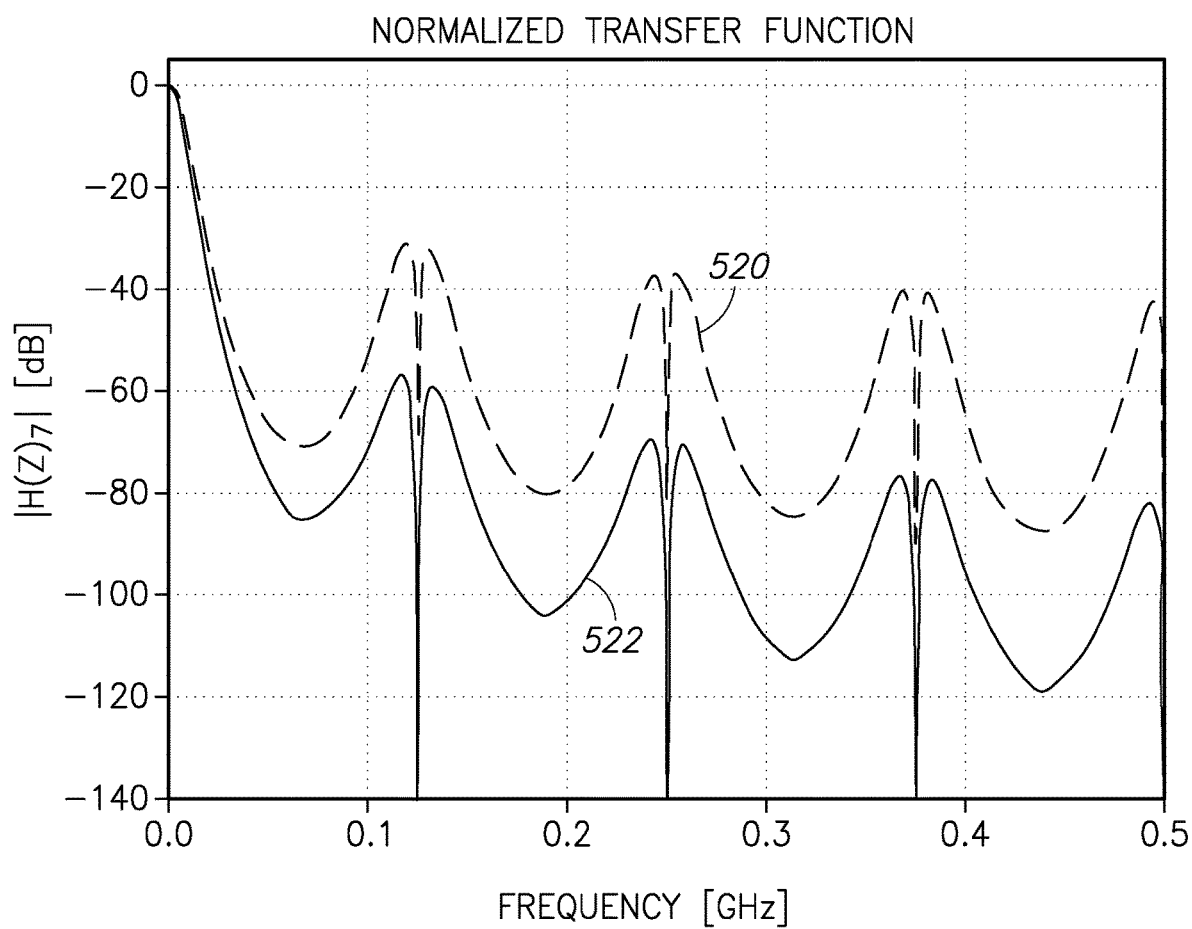
FIG. 35 is a graph comparing the ideal transfer function of the IIR filter of FIG. 30 with that of the IIR filter of FIG. 18.

A graph comparing the transfer function of the IIR filter of FIG. 30 with that of the IIR filter of FIG. 18 is shown in FIG. 35. The dashed trace 520 represents the transfer function of the discrete time IIR filter of FIG. 18 (i.e. sinc(x)) while the solid trace 522 represents the discrete time IIR filter with history capacitor arrays of FIG. 30 (i.e. sinc(x)$^2$). Note that the total value of the history capacitor in each path and the sharing capacitor in both filters is 1 pF.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A charge rotating discrete time analog filter, comprising:
    an input node for receiving an input signal;
    a plurality of arrays of history capacitors, each history capacitor array operative to perform charge sharing among its elements, wherein said plurality of arrays of history capacitors are not reset from cycle to cycle;
    a sampling capacitor coupled to said plurality of arrays of history capacitors and to said input node, said sampling capacitor operative to cyclically share charge with said plurality of arrays of history capacitors;
    wherein during each multi-phase cycle of said filter, each history capacitor array is individually connected to said sampling capacitor such that only a single history capacitor array is connected to and sharing charge with said sampling capacitor during each phase;
    wherein while a history capacitor array is connected to said sampling capacitor, its capacitance is dynamically changed thereby delivering charge nonuniformly in a plurality of steps; and
    wherein an output node coupled to one of said history capacitors arrays generates a filtered output signal once each cycle.

2. The filter according to claim 1, wherein each history capacitor array comprises a bank of switchable capacitors connected in parallel to each other and to a non-switched capacitor.

3. The filter according to claim 1, wherein a resulting transfer function of said charge rotating discrete time analog filter is a sinc(x)² function.

4. The filter according to claim 1, wherein said sampling capacitor is periodically discharged to ground once per cycle.

5. The filter according to claim 1, wherein said sampling capacitor performs charge sharing sequentially with said plurality of history capacitor arrays each cycle.

6. The filter according to claim 1, further comprising a set of switches configured to perform charge sharing between said sampling capacitor and said plurality of history capacitor arrays.

7. The filter according to claim 6, further comprising a multi-phase clock operative to turn on said switches at appropriate times.

8. A pipelined charge rotating discrete time analog filter, comprising:
an input node for receiving an input signal;
a first history capacitor array coupled to said input node;
a plurality of switch banks coupled to said first history capacitor array, each switch bank comprising:
a non-switched sampling capacitor coupled to a reset switch and configured to share charge with said first history capacitor array;
a plurality of second history capacitor arrays coupled to and configured to cyclically share charge with the sampling capacitor in each respective switch bank, each first and second history capacitor array operative to perform charge sharing among its elements, wherein said first and second history capacitor arrays are not reset from cycle to cycle;
wherein during each multi-phase cycle of said filter, each second history capacitor array individually connected to its respective sampling capacitor such that only a single second history capacitor array is connected to said sampling capacitor during each phase;
wherein while a second history capacitor array is connected to its respective sampling capacitor, its capacitance is dynamically changed thereby delivering charge nonuniformly in a plurality of steps; and
wherein an output node coupled to one of said history capacitors arrays in a switch bank generates a filtered output signal once each phase period.

9. The filter according to claim 8, wherein each first and second history capacitor array comprises a bank of switchable capacitors connected in parallel to each other and to a non-switched capacitor.

10. The filter according to claim 8, wherein charge on each second history capacitor array is transferred to said sampling capacitor in each respective switch bank in multiple steps at a rate faster than a sampling period.

11. The filter according to claim 8, wherein the sampling capacitor in each bank is periodically discharged to ground once per cycle via its respective reset switch.

12. The filter according to claim 8, wherein each switch bank comprises a plurality of switches, each switch coupled to its sampling capacitor and to a respective one of said second history capacitor arrays, said plurality of switches operative to perform charge sharing between its sampling capacitor and respective second history capacitor array.

13. The filter according to claim 12, further comprising a multi-phase clock operative to turn on said plurality of switches in each switch bank at appropriate times resulting in pipelined operation of said filter.

14. A method of analog charge rotating filtering in discrete time, the method comprising:
receiving an input signal;
charging a first history capacitor array with said input signal;
sharing charge with a sampling capacitor coupled to said first history capacitor array;
cyclically sharing charge between said sampling capacitor and a plurality of second history capacitor arrays, each first and second history capacitor array operative to perform charge sharing among its elements;
wherein during each multi-phase cycle of said filter, each second history capacitor array is individually connected to said sampling capacitor such that only a single second history capacitor array is connected to said sampling capacitor during each phase;
wherein an output node coupled to one of said second history capacitors arrays generates a filtered output signal once each cycle; and
wherein while each history capacitor array is connected to said sampling capacitor, its capacitance is dynamically changed during multiple sub-phases of said multi-phase cycle thereby delivering charge nonuniformly in a plurality of steps.

15. The method according to claim 14, wherein each first and second history capacitor array comprises a bank of switchable capacitors connected in parallel to each other and to a non-switched history capacitor.

16. The method according to claim 14, wherein charge on each second history capacitor array is transferred to said sampling capacitor in multiple steps at a rate faster than a sampling period.

17. A pipelined charge rotating discrete time analog filter, comprising:
an input node for receiving an input signal;
a first history capacitor array coupled to said input node;
a plurality of switch banks coupled to said first history capacitor, each switch bank comprising:
a first switch coupled to said input signal;
a sampling capacitor coupled to said first switch and to a reset switch, said sampling capacitor configured to cyclically share charge with a plurality of history capacitor arrays during each cycle of the filter;
a plurality of second switches coupled to a plurality of second history capacitor arrays, each switch coupled to said sampling capacitor and to a respective second history capacitor array;
wherein during each multi-phase cycle of said filter, each history capacitor array is individually connected to its respective sampling capacitor such that only a single history capacitor array in each switch bank is connected to its respective sampling capacitor during each phase;
wherein an output node coupled to one of said second history capacitors arrays generates a filtered output signal once each phase period; and
wherein while a history capacitor array is connected to said sampling capacitor in a respective switch bank, its capacitance is increased during multiple sub-phases of said multi-phase cycle.

18. The filter according to claim 17, wherein each history capacitor array comprises a bank of switchable capacitors connected in parallel to each other and to a non-switched capacitor.

19. The filter according to claim 17, wherein a resulting transfer function of said charge rotating discrete time analog filter is a sinc(x)² function.

20. The filter according to claim 17, wherein said sampling capacitor is periodically discharged to ground once per cycle via a respective reset switch.

\* \* \* \* \*